(12) United States Patent
Shako et al.

(10) Patent No.: US 7,613,251 B2
(45) Date of Patent: Nov. 3, 2009

(54) DISTORTION COMPENSATING APPARATUS AND METHOD

(75) Inventors: Hideharu Shako, Kawasaki (JP);
Yasuhito Funyu, Kawasaki (JP);
Takeshi Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 432 days.

(21) Appl. No.: 11/528,354

(22) Filed: Sep. 28, 2006

(65) Prior Publication Data

US 2007/0274471 A1   Nov. 29, 2007

(30) Foreign Application Priority Data

May 26, 2006   (JP) ............... 2006-147113

(51) Int. Cl.
*H04L 25/49* (2006.01)

(52) U.S. Cl. ...................... 375/296; 375/297

(58) Field of Classification Search ......... 375/295–297, 375/285; 332/123–125, 159, 149, 160, 161; 455/91, 114.2
See application file for complete search history.

(56) References Cited

U.S. PATENT DOCUMENTS

| | | | | |
|---|---|---|---|---|
| 5,404,378 A * | 4/1995 | Kimura | ............... | 375/296 |
| 6,798,843 B1 * | 9/2004 | Wright et al. | ............... | 375/296 |
| 6,864,745 B2 * | 3/2005 | Ode et al. | ............... | 330/149 |
| 6,960,958 B2 * | 11/2005 | Matsuura et al. | ............ | 330/149 |
| 7,102,969 B2 * | 9/2006 | Tsukamoto et al. | ........ | 369/47.5 |
| 7,106,133 B2 * | 9/2006 | Hamada et al. | ............. | 330/149 |
| 7,215,717 B2 * | 5/2007 | Doi | .............. | 375/297 |
| 7,242,247 B2 * | 7/2007 | Hirose et al. | ................ | 330/149 |
| 7,469,491 B2 * | 12/2008 | McCallister et al. | ........ | 375/296 |
| 2004/0248516 A1 | 12/2004 | Demir et al. | | |

FOREIGN PATENT DOCUMENTS

| | | |
|---|---|---|
| EP | 1 489 803 A1 | 12/2004 |
| EP | 1 791 310 A | 5/2007 |
| JP | 10-327209 | 12/1998 |

(Continued)

OTHER PUBLICATIONS

Garcia-Dicar, P. et al.: "An Imbalances Cancellation Method With Memory In A LINC Transmitter for Wideband Systems"; Vehicular Technology Conference; Sep. 25-28, 2005; pp. 1930-1934, XP010878810.
(European Search Report EP 06 25 5149; dated Oct. 25, 2007).

*Primary Examiner*—Tesfaldet Bocure
(74) *Attorney, Agent, or Firm*—Hanify & King, P.C.

(57) ABSTRACT

The apparatus includes: distortion amount detector which detects the amount of distortion of an output signal of an amplifier; parameter holder which holds a parameter having been set therein, the parameter holder being capable of varying the difference according to the parameter set therein; parameter corrector which corrects the parameter held in the parameter holder in such a manner that the distortion amount detected by the distortion amount detector is improved; noise component detector which detects a noise component that can be caused in the output signal resulting from a quadrature modulation; and noise component remover which performs processing for removing the noise component detected by the noise component detector. This arrangement makes it possible to suppress image frequency component generation in an output signal of the amplifier accompanying quadrature modulation and to optimize parameters in distortion compensation.

11 Claims, 17 Drawing Sheets

FOREIGN PATENT DOCUMENTS

| | | |
|---|---|---|
| JP | 2001-016283 | 1/2001 |
| JP | 2002 077285 | 3/2002 |
| JP | 2004-015310 | 1/2004 |
| WO | WO02/087097 | 10/2002 |
| WO | WO 2005/072331 A2 | 8/2005 |
| WO | WO 2006/030481 | 3/2006 |

* cited by examiner

US 7,613,251 B2

DISTORTION COMPENSATING APPARATUS AND METHOD

CROSS REFERENCE TO RELATED APPLICATIONS

This application is based on and hereby claims priority to Japanese Application No. 2006-147113 filed on May 26, 2006 in Japan, the contents of which are hereby incorporated by reference.

BACKGROUND OF THE INVENTION (1) Field of the Invention:

The present invention relates to a distortion compensating apparatus and a distortion compensating method. The invention relates particularly to an art suitable for use in a predistortion amplifier which compensates for nonlinearity of an amplifier by adaptively updating a distortion compensation coefficient for an input signal input to the amplifier based on a difference between input and output signals.

(2) Description of the Related Art:

FIG. 11 is a block diagram showing a construction of an important part of a previous Digital Predistortion (DPD) amplifier. The DPD amplifier of FIG. 11 includes: a Lookup Table (LUT: a distortion compensation table) 110; an address generator 111; an LMS arithmetic operator (distortion compensation arithmetic operation unit) 112; a multiplier 113; an equalizer filter (complex filter) 114; a digital/analog (D/A) converter 115; a Quadrature Modulating unit (QMOD) 116; a local oscillator 117; an amplifier 118; a directional coupler 119; a mixer (multiplier) 120; a local oscillator 121; an analog/digital (A/D) converter 122; a 1/M clock (CLK)-unit delay circuit 123; a clock (CLK)-unit delay circuit 124; and a subtracter 125; an FFT arithmetic operator 126; an integrator 127; a bus 128; and a CPU 129.

In the DPD amplifier with such a construction, a complex signal X(I, Q), composed of an I channel signal and a Q channel signal, is input as an input signal (digital signal). The multiplier 113 multiplies the complex signal X(I, Q) by a distortion compensation coefficient given by the distortion compensation table 110, thereby performing distortion compensation, and the complex signal X(I, Q) is input to the equalizer filter 114. In this instance, the above complex signal X(I, Q) is also input to the address generator 111, which generates an index address for distortion compensation table 110, and the clock (CLK)-unit delay circuit 124, as a reference signal, respectively.

The equalizer filter 114 controls its internal parameter (filter coefficient) to perform inverse characteristic filtering of the frequency characteristic of the input signal X(I, Q) as schematically shown in FIG. 12, so that the phases of the reference signal X(I, Q) and a feedback signal Y(I, Q) of an output of the amplifier 118, which are input to the LMS arithmetic operator 112, do not have frequency components. As a result, a linear inclination frequency characteristic of an analogue circuit is compensated for. In this instance, in FIG. 12, the input signal X(I, Q) is a multi carrier signal including four carriers of C1, C2, C3, and C4. FIG. 12 shows that the above-described filtering is capable of compensating for the frequency deviation of the power values of the carriers C1 through C4.

With this arrangement, the phase relationship of each carrier signal component (C1, C2, C3, and C4) on the frequency axis (domain) between the reference signal X(I, Q) and the feedback signal Y(I, Q) becomes constant, the DPD operation ability being thereby improved. In this instance, although FIG. 11 does not illustrate it, the equalizer filter 114 is connected to the CPU 129 via the bus 128, and the above-mentioned filter coefficient is controlled by the CPU 129.

The signal, whose frequency characteristic is compensated for by the equalizer filter 114 as described above, is converted into an analogue signal by the D/A converter 115, and is then modulated (quadrature modulation) by the quadrature modulating unit 116 based on an output of the local oscillator 117, and is input to the amplifier 118 as a signal in a radio frequency (RF) band. The input signal is amplified by the amplifier 118 up to a required power value (transmission power value), and is then output.

A part of the output signal is split by the directional coupler 119, and is fedback to the mixer 120, which multiplies the split signal by an output of the local oscillator 121, thereby demodulating (quadrature detection) the signal. The demodulated signal is output as a signal in an IF band, and is then converted into a digital signal (complex signal) Y(I, Q) by the A/D converter 122. After that, the signal is input to the 1/M clock (CLK)-unit delay circuit 123, the FFT arithmetic operator 126, and the integrator 127.

As schematically shown in FIG. 13, for example, the 1/M clock-unit delay circuit (digital filter) 123 delays the feedback signal Y(I, Q) so that the above feedback signal Y(I, Q) and the reference signal X(I, Q) are input to the subtractor 125 at the same timing. For this purpose, the 1/M clock-unit delay circuit 123 is capable of delaying the feedback signal Y(I, Q) with an accuracy of 1/M clock, by controlling its internal parameter [a filter (tap) coefficient of a delay filter tap from 0 to (M−1): M is an arbitrary number], as shown in FIG. 13. The 1/M clock-unit delay circuit 123 delays the feedback signal Y(I, Q) by a desired time Δt in 1/M clock units, and inputs the delayed signal Y to the subtracter 125. The reference signal X(I, Q) is delayed by the clock-unit delay circuit 124 in clock units, and is then input to the subtractor 125.

That is, to realize comparison of signals of the same time by the subtracter 125, these delay circuits 123 and 124 separately delay the reference signal X(I(t−n), Q(t−n)) and the feedback signal Y(I(t−Δt), Q(t−Δt)), which are deviated in a time relationship, to make the two signals match on the time axis with good accuracy. At that time, the delay amount Δt (fine adjustment), which is smaller than a clock frequency, is delayed by the digital filter 123. In this instance, this digital filter 123 is also connected to the CPU 129 via the bus 128, and the CPU 129 controls the internal parameter (filter coefficient) of the digital filter 123, thereby controlling a delay amount.

Then, the subtracter 125 performs subtraction processing on the signals X (I, Q) and Y (I, Q) of the same time, whose input timings are matched due to the above delay adjustment, thereby detecting an error signal. On the basis of the error signal, the distortion compensation arithmetic operator 112 updates distortion compensation coefficients in the distortion compensation table 110 using, for example, the LMS algorithm.

As described above, the DPD amplifier adaptively updates a distortion compensation coefficient used in distortion compensation (multiplier 113) of the input signal X (I, Q) based on a difference (error) between the reference signal X(I, Q) and the feedback signal Y(I, Q), and compensates for nonlinear distortion of the amplifier 118, thereby improving the amplification efficiency.

Here, internal parameters (filter coefficients) of the equalizer filter 114 and the digital filter 123 are adaptively corrected by the CPU 129. That is, the FFT arithmetic operator 126 performs FFT processing on the feedback signal Y(I, Q), thereby performing frequency analysis. From the result (FFT result data), the CPU 129 obtains data equivalent to ACLR (Adjacent Channel Leakage Ratio) 5 MHz carrier separation under the 3GPP standards.

For example, in a case where data (data of frequency vs. power value) shown in FIG. 15 is obtained as the FFT result data, the CPU 129 obtains data of measurement points (monitoring range) indicated by the frames 100 whose center frequency is apart from the center frequency of the power value obtaining points indicated by the frames 200 by 5 MHz in the central direction. In this instance, in FIG. 15, the power value obtaining points 200 indicate ranges of power values obtained by an integration operation by the integrator 127; C1, C2, C3, and C4 designate carrier signal components already described.

As schematically shown in FIG. 14, of the data obtained at the above-mentioned measurement points 100, the CPU 129 compares high-frequency data with low-frequency data, and regards the worse data (data with a greater distortion deterioration amount within the monitoring range) as distortion data. The CPU 129 obtains the distortion data while changing the above-mentioned parameters, and corrects the parameters so that the distortion data is improved. Here, with the construction shown in FIG. 11, the distortion amount is not only changed by changing the parameters, and the distortion amount difference becomes definite by updating distortion compensation coefficients in the distortion compensation table 110.

In this instance, the integrator 127 integrates the feedback signal Y(I, Q), and notifies the CPU 129 of the power value (the power value obtained at the power value obtaining points 200 in FIG. 15) via the bus 128, thereby making it possible for the CPU 129 to detect abnormal transmission power and to output an alarm.

The following patent document 1 proposes another previous DPD technology.

The following patent document 1 obtains a delay time caused in a power amplifier and a feedback loop based on a signal noise ratio SNR, an adjacent channel leakage power ratio ACLR, or a noise level Pn, etc. As to a distortion compensating apparatus with a function of controlling the timings in various elements of the distortion compensating apparatus on the basis of the thus obtained delay time, patent document 1 intends to accurately determine and sets the delay time automatically in order to make a setting error of the delay time small.

Thus, in the technology of the patent document 1, a feedback signal is subjected to Fast Fourier Transformation (FFT). By using the FFT operation result, any of the values of the signal noise ratio SNR, the adjacent channel leakage power ratio ACLR, and the noise level Pn is calculated. Adjustment of a delay time caused in a distortion device and a feedback loop is repeated so that the difference between the above calculation value at the current time and the calculation value at the previous time becomes zero or smaller than a threshold value, thereby determining an accurate delay time. On the basis of the delay time, timings of various elements of the distortion compensating apparatus are matched.

[Patent Document 1] International Publication No. WO 2002/087097 pamphlet

In the DPD amplifier employing the direct modulation method, an image frequency component (noise component) is generated in a transmission output due to incompleteness of the above-mentioned quadrature modulator 116. Due to the effects of the image frequency component (hereinafter, simply called the "image" or the "image component"), a state in which a distortion component of the feedback signal Y (an output signal of the amplifier 118) cannot be accurately detected occurs. For example, as shown in FIG. 16(A), when the IQ amplitude balance is lost, or as shown in FIG. 16(B), when the IQ quadrature(orthogonality) is lost, the locus of the vector of the main signal in the IQ plane takes a oval shape, and as shown in FIG. 16(C), an image (noise component) with respect to a main signal appears at a specific frequency of a transmission output with the output frequency of the local oscillator 117 as a center (a center frequency).

When this image generation point and the aforementioned measuring point (distortion component detection point) overlap in a frequency domain of a feedback signal Y, as shown in FIG. 17, the CPU 129 is incapable of distinguishing between the two in the FFT result data, and thus, the CPU 129 can erroneously select the image as distortion data, so that accurate distortion amount detection is unavailable. As a result, every time parameters are updated, the parameters can be separated from the optimum parameter values, so that optimization of parameters is not available.

SUMMARY OF THE INVENTION

With the foregoing problems in view, it is an object of the present invention to suppress generation of the aforementioned image in a feedback signal (an output signal of an amplifier) accompanying the aforementioned quadrature modulation. The purpose of the invention is to make it possible to optimize the above-mentioned parameters in distortion compensation.

In order to accomplish the above object, the present invention is characterized in that the following distortion compensating apparatus and the following distortion compensating method are used.

(1) As a generic feature, there is provided a distortion compensating apparatus which compensates for nonlinearity of an amplifier by quadrature-modulating an input signal before inputting the input signal to the amplifier and by adaptively updating a distortion compensation coefficient for the input signal based on a difference between the input signal and an output signal of the amplifier, the apparatus comprising: a distortion amount detecting means which detects the amount of distortion of an output signal of the amplifier; a parameter holding means which holds a parameter having been set therein, the parameter holding means being capable of varying the difference according to the parameter set therein; a parameter correcting means which corrects the parameter held in the parameter holding means in such a manner that the distortion amount detected by the distortion amount detecting means is improved; a noise component detecting means which detects a noise component that can be caused in the output signal resulting from the quadrature-modulation; and noise component removing means which performs processing for removing the noise component detected by the noise component detecting means.

(2) As a preferred feature, the noise component removing means includes: an amplitude balance correcting unit which corrects amplitude balance between an I channel signal component and a Q channel signal component of the input signal; an amplitude balance control unit which controls the correction of the amplitude balance performed by the amplitude balance correcting unit in such a manner that the noise component detected by the noise component detecting means becomes minimum.

(3) As another preferred feature, the noise component removing means includes: a quadrature degree correcting unit which corrects the quadrature degree between an I channel signal component and a Q channel signal component of the input signal; and a quadrature degree control unit which controls the quadrature degree correction performed by the quadrature degree correcting unit in such a manner that the noise component detected by the noise component detecting means becomes minimum.

(4) As yet another preferred feature, the amplitude balance controlling unit includes: an I channel difference detecting circuit which detects a difference of an I channel signal component between the output signal of the amplifier and the input signal; a Q channel difference detecting circuit which detects a difference of a Q channel signal component between the output signal of the amplifier and the input signal; and an amplitude balance correction value calculating unit which obtains an amplitude balance correction value that makes the difference detected by the difference detecting circuits minimum, and the amplitude balance correcting unit includes: an amplitude correcting circuit which separately corrects the amplitudes of the I channel signal component and the Q channel signal component of the input signal with a correction value obtained by the amplitude balance correction value calculating unit.

(5) As another generic feature, there is provided a distortion compensating method for compensating for nonlinearity of an amplifier by quadrature-modulating an input signal before inputting the input signal to the amplifier and by adaptively updating a distortion compensation coefficient for the input signal based on a difference between the input signal and an output signal of the amplifier, the method comprising the steps of: (a) detecting the amount of distortion of an output signal of the amplifier; (b) correcting a parameter held in a parameter holding means, which is capable of varying the difference according to the parameter set therein, in such a manner that the distortion amount detected at the step (a) is improved; (c) detecting a noise component that can be caused in the output signal resulting from the quadrature-modulation; and (d) performing processing for removing the noise component detected on the step (c).

According to the present invention, parameter correction is performed after suppressing effects (noise component generation) of incompleteness of quadrature modulation. As a result, a state where a distortion component cannot be accurately detected due to the effects of a noise component (image component) is avoided, and a phenomenon in which parameters are separated from their optimum values every time the parameters held in the parameter holding means are updated is prevented, so that optimization of the parameters becomes available.

Other objects and further features of the present invention will be apparent from the following detailed description when read in conjunction with the accompanying drawings.

DESCRIPTION OF THE PREFERRED EMBODIMENT(S)

Figure 1:
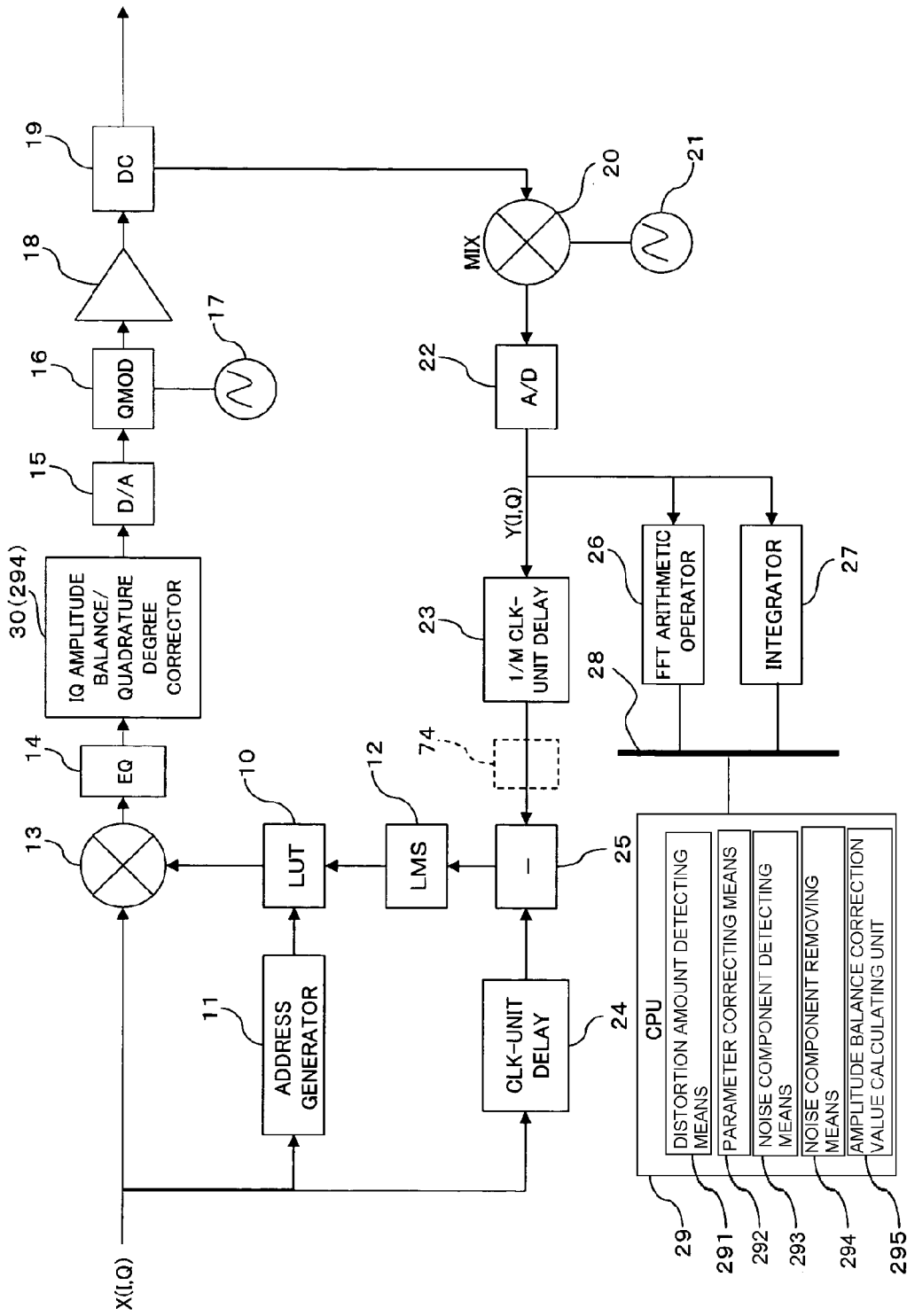
FIG. 1 is a block diagram showing a construction of an important part of a Digital Predistortion (DPD) amplifier (distortion compensating apparatus) according to one preferred embodiment of the present invention.

[A] One Preferred Embodiment:

FIG. 1 is a block diagram showing a construction of an important part of a digital predistortion amplifier (distortion compensating apparatus) according to a first embodiment of the present invention. The DPD amplifier of FIG. 1 also includes: a Lookup Table (LUT: distortion compensation table) 10; an address generator 11; an LMS arithmetic operator (distortion compensation arithmetic operation unit) 12; a multiplier 13; an equalizer filter (complex filter) 14; a digital/analog (D/A) converter 15; a quadrature modulation unit (QMOD) 16; a local oscillator 17; an amplifier 18; a directional coupler 19; a mixer (multiplier) 20; a local oscillator 21; an analog/digital (A/D) converter 22; a 1/M-clock (CLK) unit delay circuit 23; a clock (CLK)-unit delay circuit 24; a subtractor 25; an FFT arithmetic operator 26; an integrator 27; a bus 28; a CPU 29; and an IQ amplitude balance/quadrature degree correcting unit 30 interposed between the equalizer filter 14 and the D/A converter 15. In this instance, the DPD amplifier is applicable to, for example, a transmitter system of a base station apparatus. Further, it is assumed that an input signal (that is, transmission signal) is a multi-carrier signal.

Here, the distortion compensation table 10 stores distortion compensation coefficients, which are for compensating for distortion beforehand that can be caused when an input signal (complex signal) X(I, Q) (hereinafter also simply called X), a digital signal, is amplified by the amplifier 18. The coefficients are stored separately, for example, for power values of the input signal X. A distortion compensation coefficient of an address generated and specified by the address generator 11 based on the power value of the input signal X is supplied to the multiplier 13. The distortion compensation coefficients are adaptively updated in accordance with an arithmetic operation result obtained by the distortion compensation arithmetic operator 12.

The address generator 11 receives an input signal X, which has an I channel signal component (hereinafter also simply called an "I channel signal") and a Q channel signal component (hereinafter also simply called an "Q channel signal"), as a reference signal, and generates an index address for the distortion compensation table 10 according to the power value of the input signal. The distortion compensation arithmetic operator 12 adaptively updates distortion compensation coefficients in the distortion compensation table 10 based on a difference (error signal) between the reference signal X obtained by the subtracter 25 and a feedback signal (complex signal; detailed below) Y(I, Q) (hereinafter also simply called Y).

The multiplier (distortion compensating unit) 13 multiplies the input signal X by a distortion compensation coefficient from the distortion compensation table 10, thereby compensating beforehand for distortion which can be caused when the input signal X is amplified by the amplifier 18. The equalizer filter (complex filter) 14 is a parameter holding means which holds a parameter set therein. The equalizer filter 14, which is formed by, for example, a digital filter, can vary a difference detected by the subtracter 25 according to the parameter [filter (tap) coefficient] set therein. As already described with reference to FIG. 8, the above-mentioned internal parameter of the equalizer filter 14 is controlled, so that the equalizer filter 14 performs inverse characteristic filtering on the frequency characteristic of the input signal X, to compensate for the linear inclination frequency characteristic of an analogue circuit (frequency deviation of each carrier signal component), thereby making the phase relationship of each carrier signal component constant.

In this instance, the equalizer filter 14 has, for example, several tens of tap coefficients, and is capable of compensating for a linear inclination characteristic of a few dB, which can occur in a signal band (for example, several tens MHz width) to be amplified. In addition, the equalizer filter 14 is connected to the CPU 29 via the bus 28 (not illustrated in FIG. 1), and the above-mentioned parameter is under control of the CPU 29.

Figure 16A:
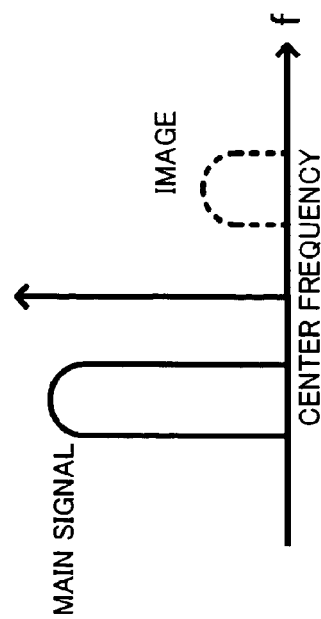
FIG. 16(A) through FIG. 16(C) are schematic diagrams for describing an image frequency component which is generated resulting from incompleteness of quadrature-modulation carried out by the quadrature modulator of FIG. 11.
Figure 16B:
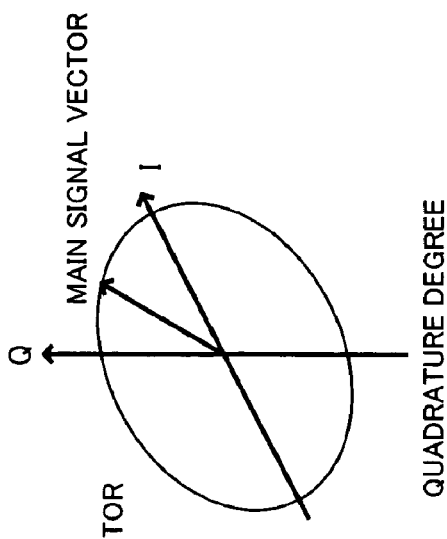
Figure 16C:
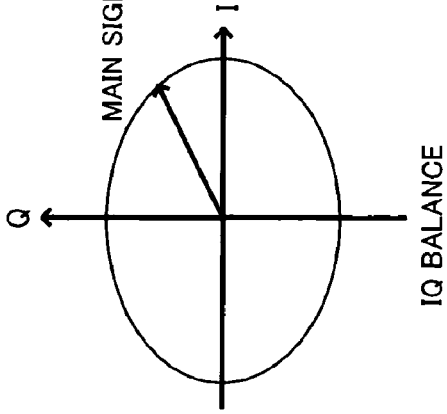
Figure 17:
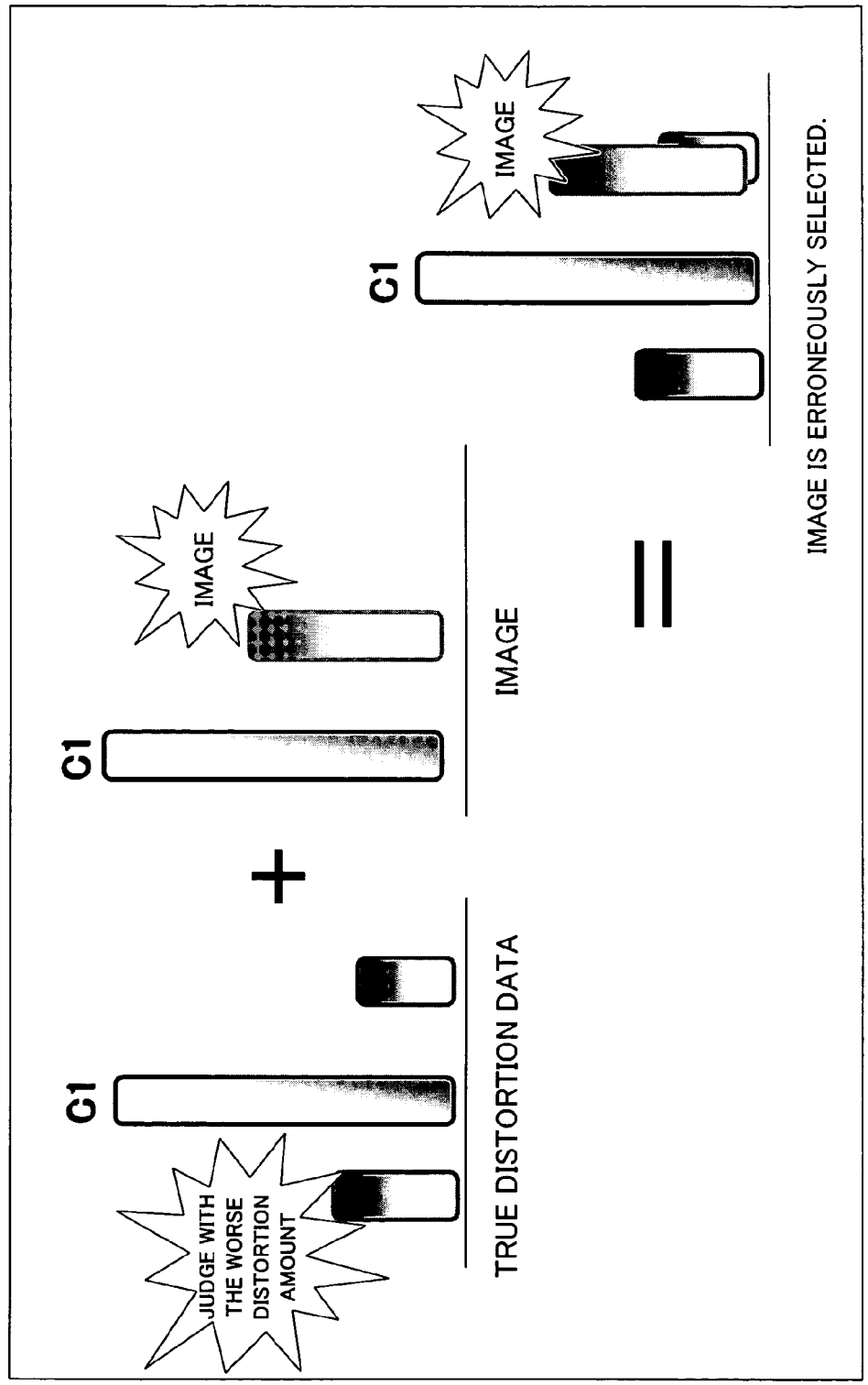
FIG. 17 is a schematic diagram for describing a problem of a previous DPD amplifier caused by generation of an image frequency component.

In order to suppress image generation which accompanies quadrature-modulation by the quadrature-modulator 16, as described above with reference to FIG. 16(A) through FIG. 16(C), the IQ amplitude balance/quadrature degree correcting unit 30 performs IQ amplitude (balance) correction and IQ quadrature correction of an output signal of the equalizer filter 14. In the present example, the IQ amplitude balance/quadrature degree correcting unit 30 is connected to the CPU 29 via the bus 28, and the CPU 29 controls the above-mentioned correction. This will be detailed below with reference to FIG. 4 through FIG. 10.

The D/A converter 15 converts a signal obtained after IQ amplitude correction and IQ quadrature degree correction performed by the IQ amplitude balance/quadrature degree correcting unit (hereinafter also simply called the "correcting unit") 30 into an analog signal. The quadrature modulation unit 16 modulates (quadrature modulation) the analog signal using a frequency signal from the local oscillator 17. The amplifier 18 amplifies the modulated signal obtained by the above modulation so that the modulated signal has a desired transmission power value.

The directional coupler 19 splits a part of an output of the amplifier 18 to feed it back to the mixer 20. The mixer 20 multiplies a feedback signal from the directional coupler 19 by a frequency signal from the local oscillator 21, thereby demodulating (quadrature detection) the feedback signal to generate a demodulation signal of an IF band. The A/D converter 22 converts the modulation signal into a digital signal, thereby obtaining a feedback signal Y(I, Q), which is a complex digital signal.

The 1/M-clock unit delay circuit 23 is a digital filter circuit (M is an arbitrary value, and delay filter taps of 0 through (M−1) are prepared) which is capable of delaying the feedback signal Y with an accuracy of 1/M clock so that the input timing of the feedback signal Y matches the input timing of the reference signal X. The 1/M-clock unit delay circuit 23 delays the feedback signal Y by a required time $\Delta t$ with an accuracy of 1/M clock unit and inputs the delayed signal to the subtractor 25. The clock-unit delay circuit 24, which is formed by, for example, one or more flip-flops (FFs), delays the reference signal X in clock units and inputs the delay signal to the subtractor 25.

That is, as already described with reference to FIG. 9, in order to realize comparison of signals of the identical time by the subtractor 25, the delay circuits 23 and 24 serve as a delay adjusting unit (a timing adjusting unit which adjusts comparison timing at the subtracter 25) which separately delays the reference signal X(I(t−n), Q(t−n)) and the feedback signal Y(I(t−$\Delta t$), Q(t−$\Delta t$), which have a time lag therebetween, to make both signals match each other with good accuracy on the time axis. At that time, a delay of $\Delta t$ (fine adjustment), which is smaller than a clock frequency, is delayed by controlling an internal parameter [filter (tap) coefficient] of the 1/M-clock unit delay circuit 23.

In other words, the digital filter 23 is also a parameter holding means which is capable of varying a difference detected by the subtracter 25 according to a parameter set therein. In this instance, the digital filter 23 is also connected to the mixer CPU 29 via the bus 28, and the CPU 29 controls the internal parameter (filter coefficient) of the 1/M-clock unit delay circuit 23, thereby controlling the delay amount of the 1/M-clock unit delay circuit 23.

The subtracter (difference detecting unit) 25 performs subtraction processing on the reference signal X and the feedback signal Y of the same time, whose input timings are matched by the above-mentioned delay adjustment, thereby detecting a difference (error signal) therebetween. On the basis of the difference, the distortion compensation arithmetic operator 12 updates distortion coefficients in the distortion compensation table 10 using, for example, the LMS algorithm.

The FFT arithmetic operator 26 receives an FFT execution instruction from the CPU 29 via the bus 28 and executes FFT processing on the feedback signal Y to carry out frequency analysis. The analysis result (FFT result data; see, for example, FIG. 15) can be obtained by the CPU 29 via the bus 28. The integrator (power monitoring means) 27 integrates the feedback signal Y for a specified time period, thereby detecting (monitoring) the power value (for example, the power value at power value obtaining points 200 in FIG. 15), and the detection result can be obtained by the CPU 29 via the bus 28.

Further, the CPU 29 acquires, from the FFT result data obtained by the FFT arithmetic operator 26, data corresponding to ACLR 5 MHz carrier separation under the 3GPP standard. The CPU 29 regards data whose distortion deterioration amount is large as distortion data, and obtains the distortion data while changing the above-mentioned parameter, and corrects the parameter so that distortion data is improved.

That is, the CPU 29 of the present example realizes (i) a function as a distortion amount detecting means 291 which detects the distortion amount of an output signal of the amplifier 18 and (ii) a function as a parameter correcting means 292 which corrects parameters of the equalizer filter 14 and the 1/M-clock unit delay circuit 23 so that the distortion amount thus detected is improved.

Figure 14:
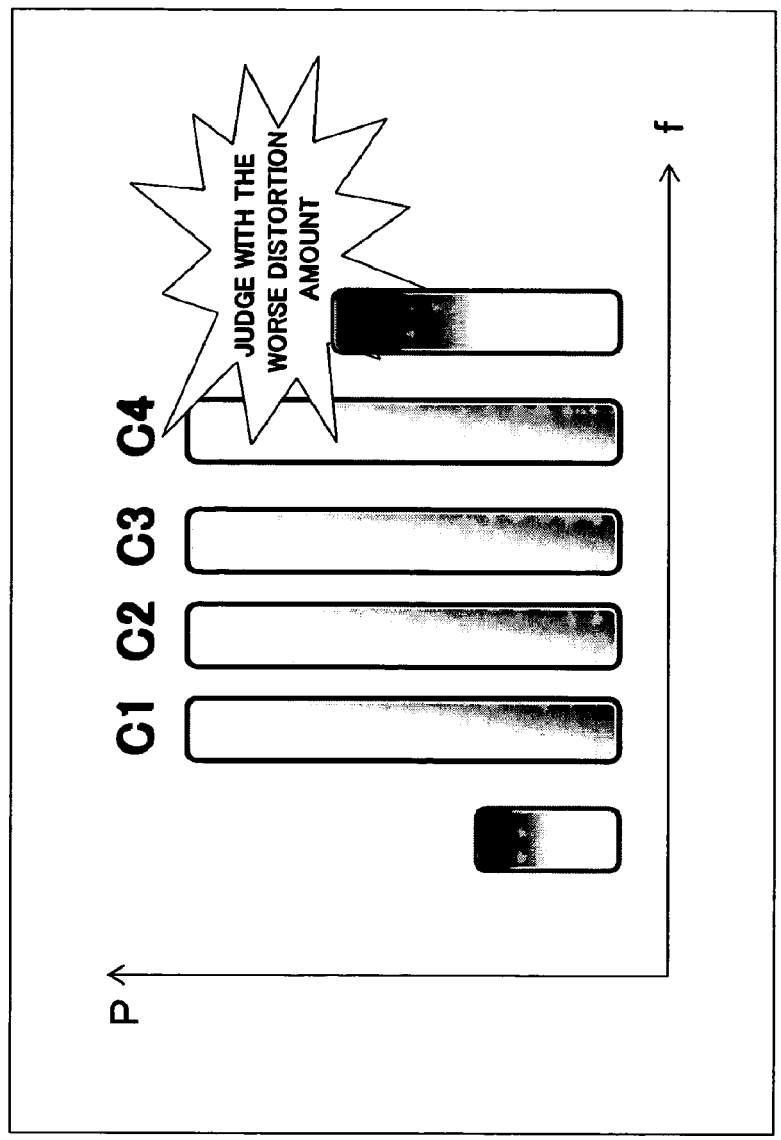
FIG. 14 is a schematic diagram for describing acquisition of distortion data by the CPU of FIG. 11.
Figure 15:
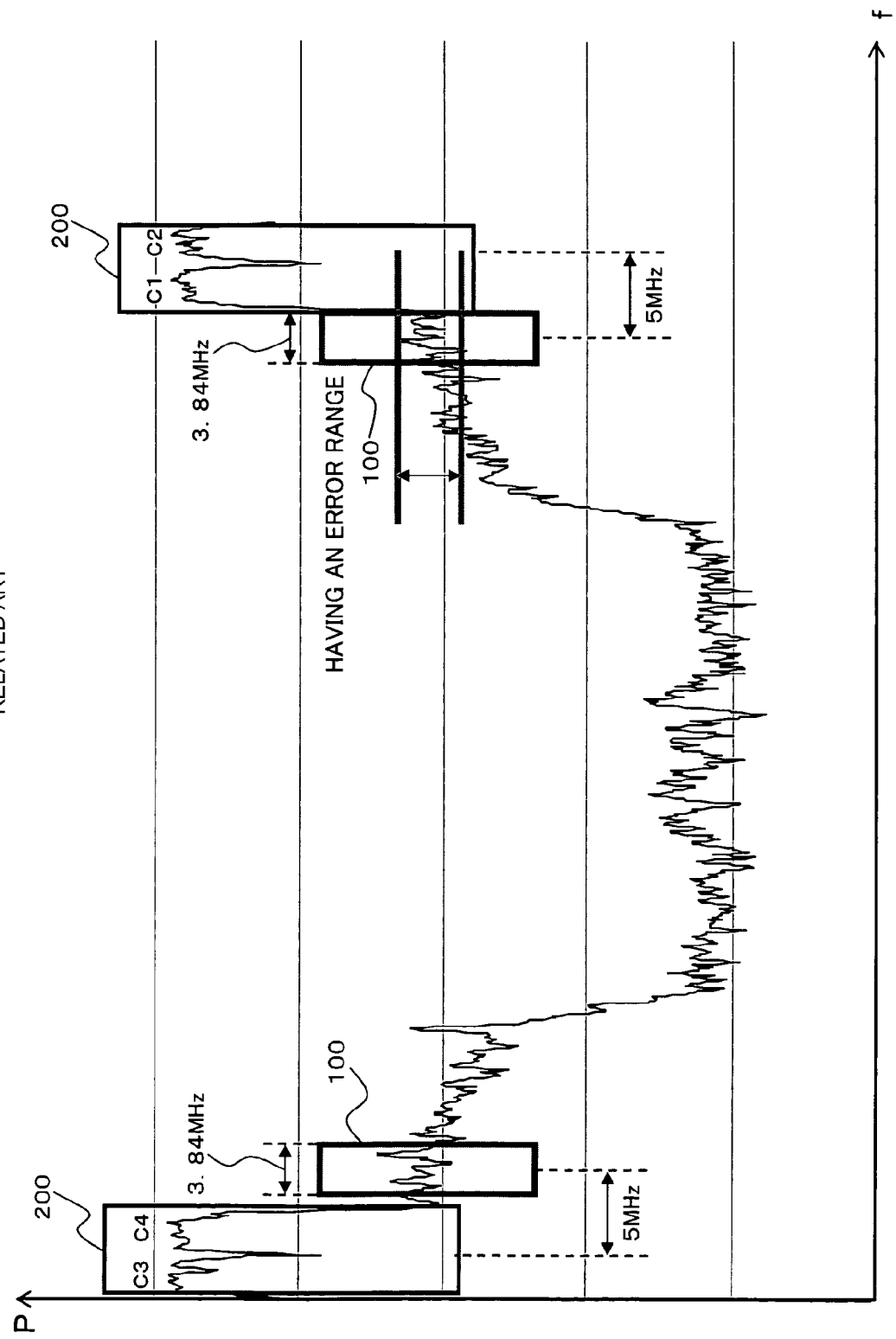
FIG. 15 is a diagram illustrating an example of arithmetic operation result (FFT result data) obtained by the FFT arithmetic operator of FIG. 11.

More specifically, as shown in FIG. 15, the CPU 29 obtains data of measurement points (monitoring range) indicated by the frames 100, whose center frequency is 5 MHz apart in the central direction from the center frequency of the power value obtaining points indicated by the frames 200. The obtained data higher in frequency is compared with the obtained data lower in frequency. As already described with reference to FIG. 14, the worse data (data within the monitoring range with the greater distortion deterioration amount) is recognized as distortion data, and the CPU 29 obtains the distortion data while changing the above-mentioned parameters, and corrects the distortion data so that the distortion data is improved. Here, in the present embodiment, also, the distortion amount is not significantly changed only by changing the parameters, and the difference of the distortion amount becomes definite by updating the distortion compensation coefficients in the distortion compensation table 10.

In this instance, in FIG. 1, reference character 74 designates a phase adjusting circuit; reference character 293, an image (noise component) detecting means; reference character 294, a noise component removing means; reference character 295, an amplitude balance correction value calculating unit. These elements will be detailed later.

Now, an operation of the distortion compensating apparatus with the above-described construction of the present embodiment will be detailed hereinbelow.

(A1) Basic Operation of the Whole Apparatus:

First of all, the multiplier 13 multiplies an input signal X by a distortion compensation coefficient provided by the distortion compensation table 11, thereby compensating for distortion thereof. After distortion compensation, the input signal X is input to the equalizer filter 14. As already described, an internal parameter (filter coefficient) of the equalizer filter 14 is controlled by the CPU 29, and the equalizer filter 14 performs filtering with an inverse characteristic of the frequency characteristic of the input signal X, thereby compensating for a linear inclination frequency characteristic of an analogue circuit.

In order to suppress (cancel) image generation, accompanying quadrature-modulation by the quadrature-modulator 16, by the IQ amplitude balance/quadrature degree correcting unit 30, the signal after being compensated for is then subjected to IQ amplitude (balance) correction and IQ quadrature degree correction. After that, the signal is converted into an analogue signal by the D/A converter 15, and is then modulated (quadrature-modulation) by the quadrature-modulator 16 based on an output of the local oscillator 17. The modulated signal is then input to the amplifier 18 as a signal in a radio frequency (RF) band, to be amplified by the amplifier 18 up to a required power value (transmission power value).

A part of the output signal is split by the directional coupler 19 and is fedback to the mixer 20, which multiplies the split signal by an output of the local oscillator 21, thereby demodulating (quadrature detection) the signal. The demodulated signal is output as a signal in an IF band, and is converted by the A/D converter 22 into a digital signal (complex signal) Y,
and is then input into the 1/M-clock unit delay circuit 23, and the FFT arithmetic operator 26, and the integrator 27.

The 1/M-clock unit delay circuit (digital filter) 23 delays the feedback signal Y by a desired time Δt in 1/M clock units so that input timings of the feedback signal Y and the reference signal X to the subtractor 25 match each other. The reference signal X is delayed by the clock-unit delay circuit 24 in clock units, and is then input to the subtractor 25.

The subtractor 25 performs subtraction processing on the reference signal X and the feedback signal Y of the same time, whose input timings are matched by the above-mentioned delay adjustment, thereby detecting an error signal. On the basis of the error signal, the distortion compensation arithmetic operator 12 updates distortion coefficients in the distortion compensation table 10 using, for example, the LMS algorithm.

As described so far, according to the DPD amplifier of the present embodiment, also, on the basis of the difference (error) between the reference signal X and the feedback signal Y, a coefficient used in distortion compensation (multiplier 13) of the input signal X is adaptively updated, whereby nonlinear distortion of the amplifier 18 is compensated for, so that amplification efficiency is improved.

Further, in the present example, the IQ amplitude balance/quadrature degree correcting unit 30 corrects IQ amplitude (balance) and IQ quadrature degree before the quadrature-modulator 16 performs quadrature modulation. Hence, image generation caused by a phenomenon in which IQ amplitude balance is lost or in which IQ quadrature is lost can be suppressed. Thus, erroneous detection of distortion data can be prevented, and internal parameters in the equalizer filter 14 and the 1/M-clock unit delay circuit 23 can be optimized.

(A2) Operation of CPU 29

Figure 2:
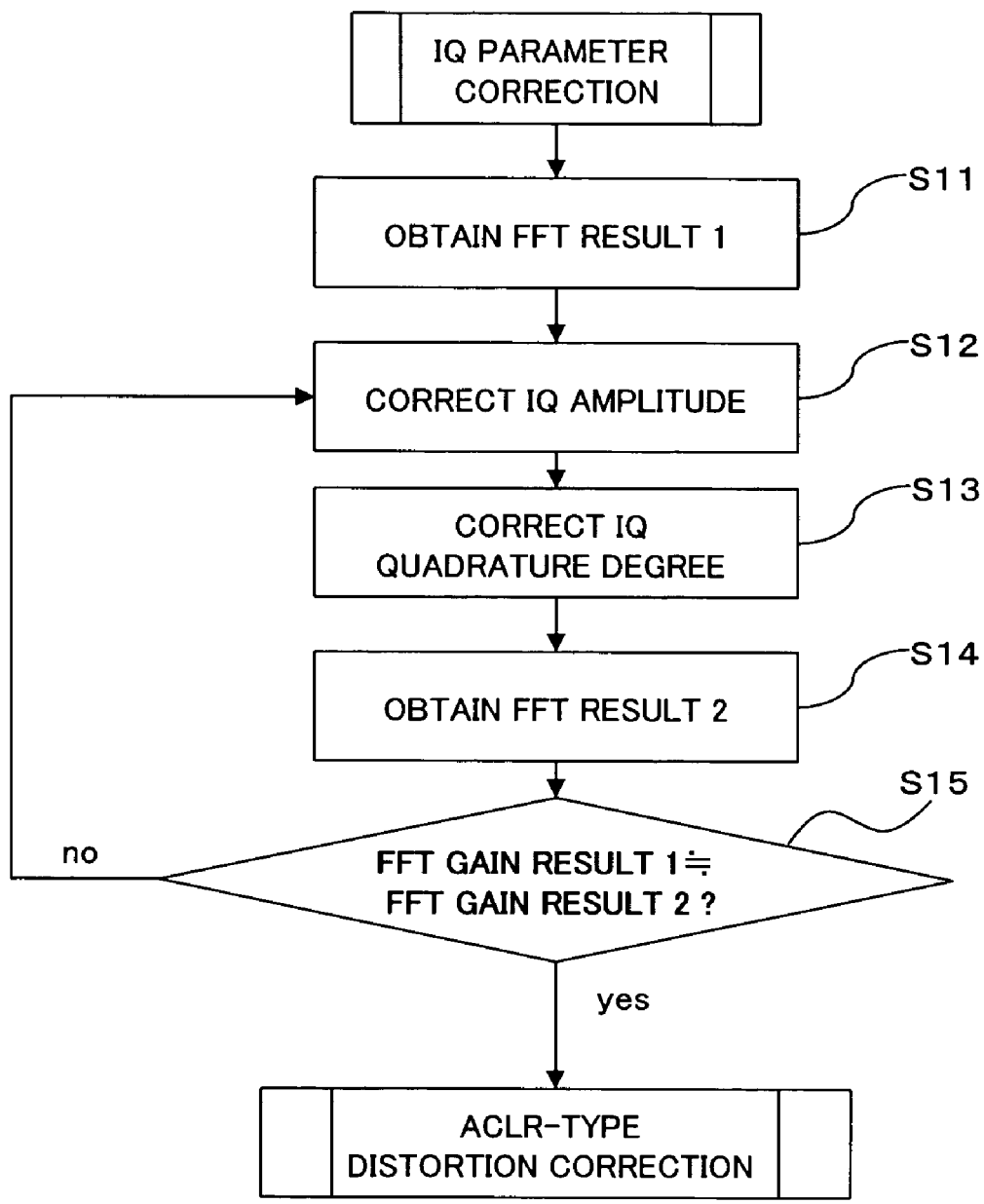
FIG. 2 is a flowchart for describing an operation (IQ parameter correction) of the DPD amplifier of FIG. 1.
Figure 3:
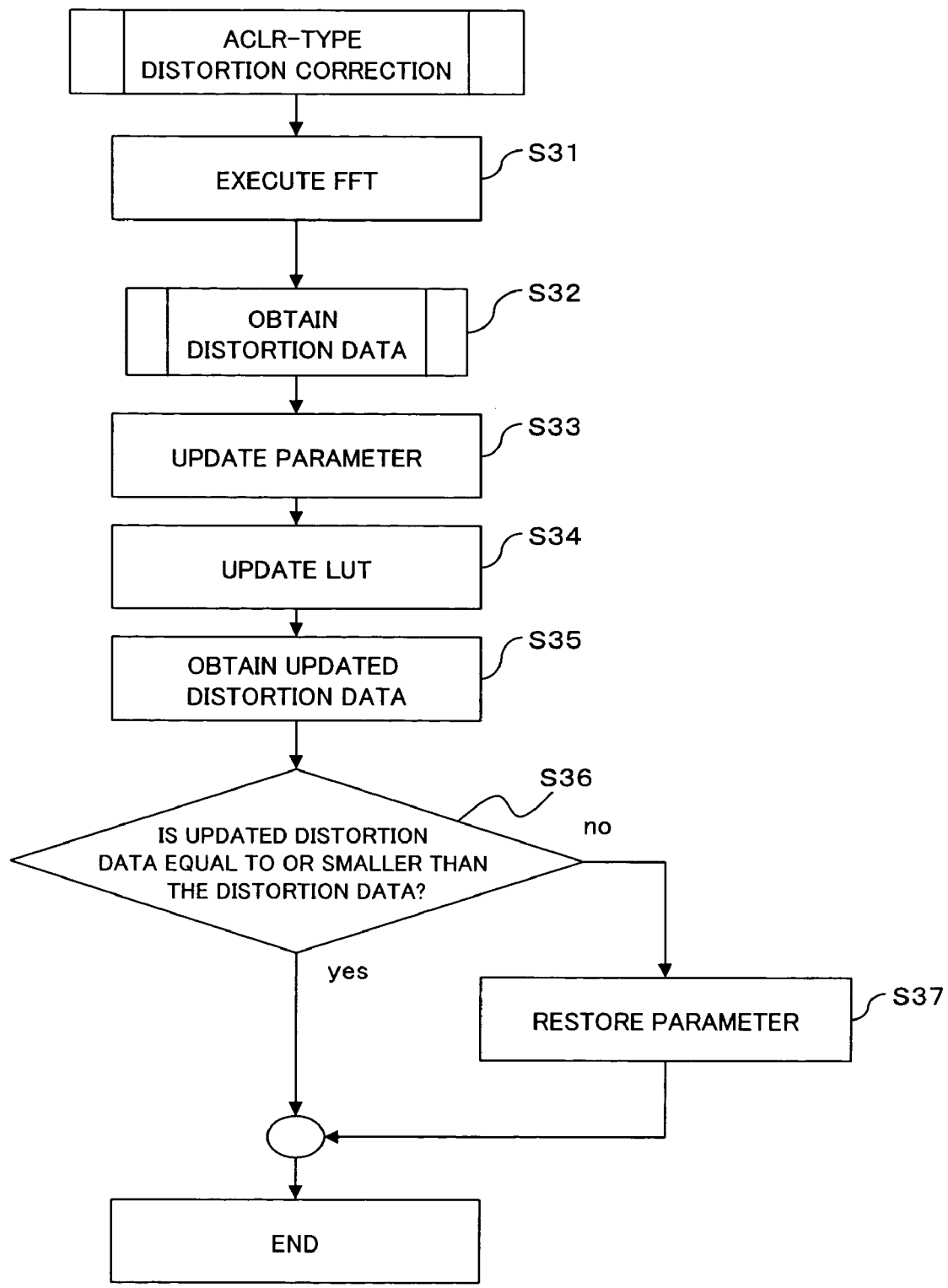
FIG. 3 is a flowchart for describing an operation (ACLR-type distortion correction) of the CPU of FIG. 1.

For the purpose of realizing the above-described technique, the CPU 29 of the present example operates according to the flowchart (IQ parameter correction processing) of FIG. 2 and the flowchart (ACLR-type distortion correction processing) of FIG. 3.

First of all, before starting the ACLR-type distortion correction processing, the CPU 29 checks if the distortion correction monitoring point (for example, measurement point 100 in FIG. 15) and an image generating point overlap each other. If they do overlap each other, as shown in FIG. 2, the CPU 29 stores FFT result data obtained by the FFT operator 26 (step S11), and the correcting unit 30 corrects IQ amplitude balance and IQ quadrature degree [steps S12 and S13; noise component removing step (amplitude balance correction step and quadrature degree correction step)]. The above will be detailed later with reference to FIG. 4 through FIG. 10.

At the end of the above correction, the CPU 29 compares once again the FFT result data obtained by the FFT operator 26 and the above-mentioned stored FFT result data (steps S14 and S15; noise component detection step). If the both sets of data match or approximately match, and no difference is found therebetween, and the data is equal to or smaller than the pre-set FFT result threshold value, the CPU 29 performs ACLR-type parameter correction processing as shown in FIG. 3 (yes route of step S15).

That is, the CPU 29 makes the FFT operator 26 perform FFT processing of the feedback signal Y, and obtains its result (FFT result data), and obtains distortion data from the FFT result data in a manner described above (steps S31 and S32; distortion amount detection step).

Next, the CPU 29 updates (changes) the above-mentioned parameters with a specified updating step width, etc., thereby updating distortion compensation coefficients in the distortion compensation table 10 (steps S33 and S34; parameter correction step). With the distortion coefficients having been updated, the CPU 29 obtains distortion data (updated distortion data) in a similar manner to the above (step S35).

Subsequently, the CPU 29 evaluates whether or not the above updated distortion data is equal to or smaller than the distortion data before being updated, which is obtained before updating of the distortion compensation coefficients (parameters) (step S36). If the updated distortion data exceeds the distortion data before being updated, it means that the above updating has increased (deteriorated) the distortion amount. Thus, the CPU 29 restores the parameters before being updated (from no route of step S36 to step S37). In contrast, if the above updated distortion data is equal to or smaller than the distortion data before being updated, it means that the distortion amount is improved or maintained. The CPU 29 thus maintains the parameter value after being updated, and ends the processing (yes route of step S36).

In contrast, in the aforementioned step S15 of FIG. 2, the FFT result data after IQ amplitude correction and IQ quadrature degree correction by the correcting unit 30 and the FFT result data stored before the correction does not meet the aforementioned condition, the CPU 29 repeats IQ amplitude correction and IQ quadrature degree correction by the correcting unit 30 until the above condition is satisfied (until judged yes on step S15) (no route of step S15).

With this arrangement, internal parameters of the equalizer filter 14 and the 1/M-clock unit delay circuit 23 are updated after an image component generated resulting from quadrature modulation by the quadrature-modulator 16 is removed. Thus, a phenomenon in which the parameters separate from their optimum values is prevented. Here, if the aforementioned condition is not satisfied after the correction process is repeated a specified number of times, the ACLR-type distortion correction processing is not carried out.

That is, according to the present embodiment, if the abovementioned FFT result data comparison result is not changed and remains equal to or smaller than a specified threshold value, while IQ amplitude balance correction and IQ quadrature degree correction are being carried out, it means that image detection and image removal control for suppressing the image to the minimum are performed.

Hence, the CPU 29 of the present embodiment carries out steps S11 through S15, thereby functioning as an image (noise component) detecting means 293 (see FIG. 1) which detects an image (noise component) which can appear in an output signal of the amplifier 18 resulting from quadrature modulation of the quadrature-modulator 16. In addition, together with the correcting unit 30, the CPU 29 functions as a noise component removing means 294 (see FIG. 1) which removes the image detected by the noise component detecting means 293.

Next, referring to FIG. 4 through FIG. 10, a description will be made of concrete examples of IQ amplitude (balance) correction and IQ quadrature degree correction performed by the correcting unit 30.

(A3) IQ Amplitude Balance Correction

Figure 4:
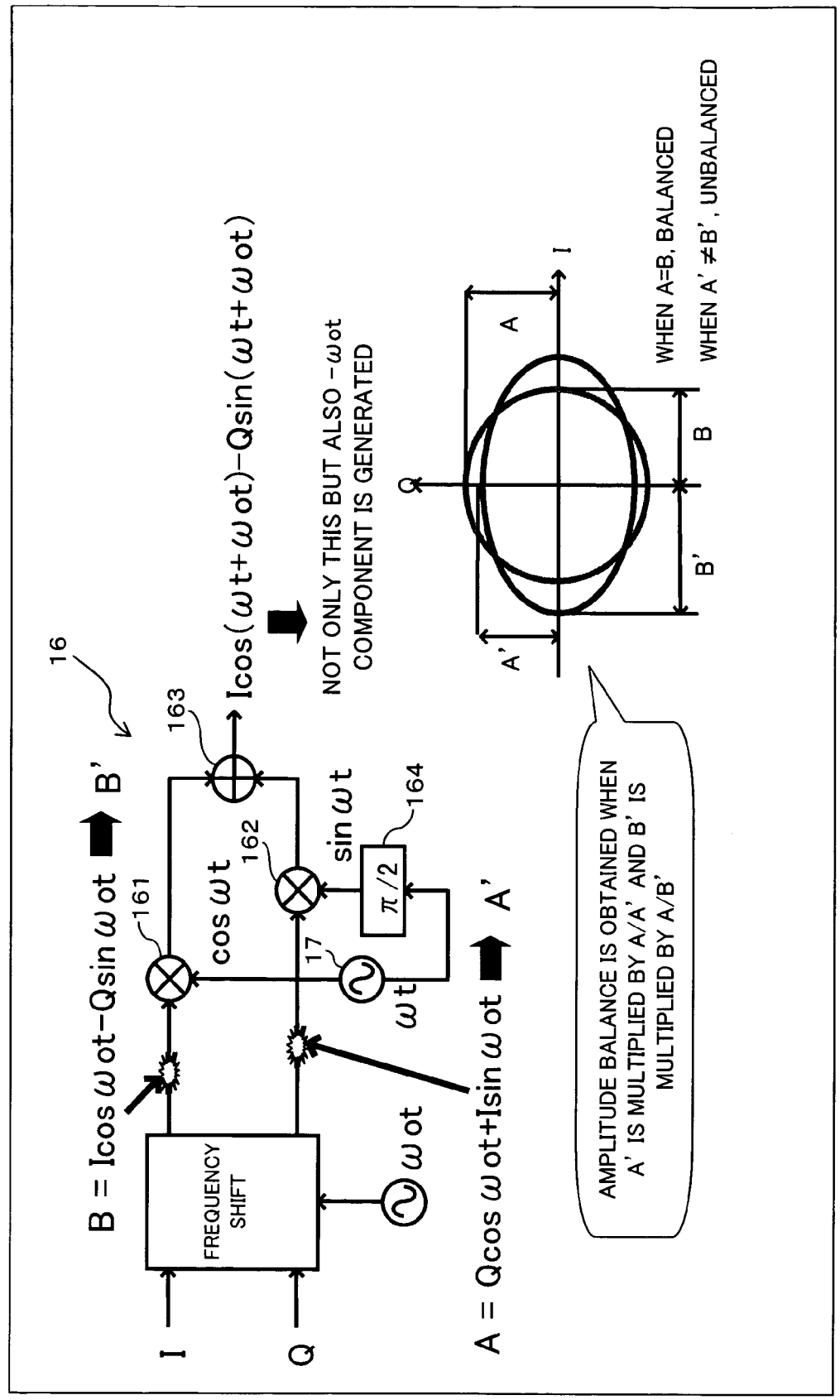
FIG. 4 is a diagram for describing a phenomenon in which IQ balance is lost.

When the amplitude balance between the I channel (Ich) signal and the Q channel (Qch) is lost, quadrature modulation cannot be successfully performed. For example, as shown in FIG. 4, in the quadrature-modulator 16, when frequency shift is performed with angular frequency $\omega o$ on the I channel signal and Q channel signal (the resultant amplitude value is given as B=I cos $\omega o$t−Q sin $\omega o$t, A=Q cos $\omega o$t+I sin $\omega o$t), and when quadrature modulation is performed with angular frequency $\omega$, the output is expressed by the following formula (1).

$$I \cos(\omega t + \omega o t) - Q \sin(\omega t + \omega o t) \quad (1)$$

Here, the amplitude balance of data input to the quadrature-modulator 16 is lost (for example, when A=A' and B=B', A'≠B'), the following formula (2) is obtained, and (−$\omega o$t) component is left. This (−$\omega o$t) component becomes the aforementioned image.

$$I \cos(\omega t + \omega o t) - Q \sin(\omega t + \omega o t) + \alpha \{ I \cos(\omega t - o t) + Q \sin (\omega t - \omega o t) \} \quad (2)$$

Accordingly, it is possible to establish the amplitude balance by multiplying A' by A/A' and by multiplying B' by A/B'.

Figure 5:
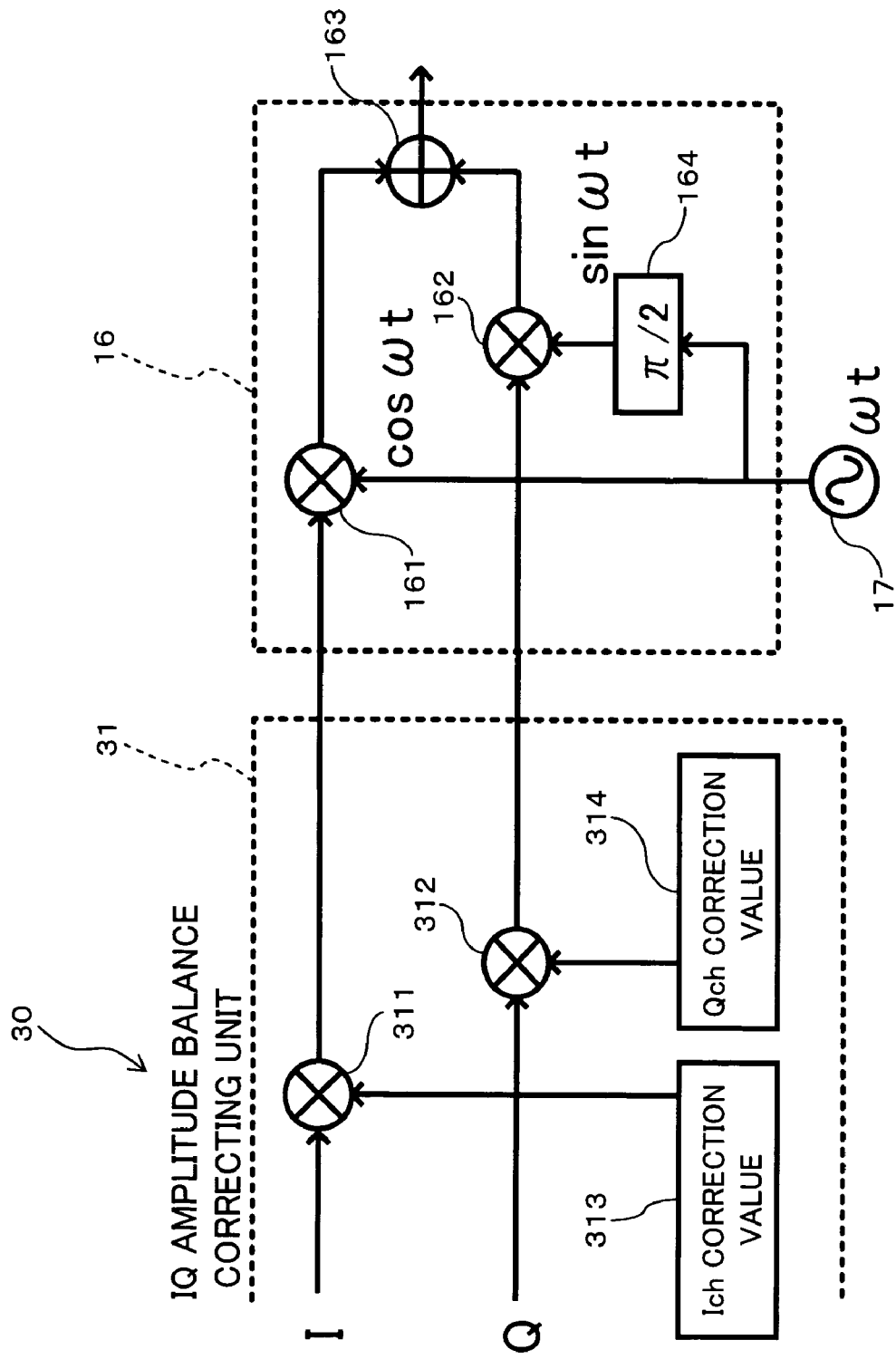
FIG. 5 is a block diagram illustrating constructions of the IQ amplitude balance/quadrature degree corrector (IQ amplitude balance correcting unit) and the quadrature-modulator of FIG. 1.

Then, as shown in FIG. 5, for example, the correcting unit 30 of the present example has an IQ amplitude balance correcting unit 31 including: a multiplier (gain adjusting circuit) 311, which multiplies the I channel signal by a correction (gain) value (for example, the abovementioned A/A') before the quadrature-modulator 16; a multiplier (gain adjusting circuit) 312, which multiplies the Q channel signal by a correction (gain) value (for example, the above mentioned A/B') before the quadrature-modulator 16; a register 313 which holds the above-mentioned correction value for the I channel signal; and a register 314 which holds the abovementioned correction value for the Q channel signal. That is, the amplitude balance correcting unit 31 functions as an amplitude correcting circuit which separately corrects an I channel signal component and a Q channel signal component of the input signal X with IQ amplitude balance correction value obtained by the CPU 29 (amplitude balance correction value calculator 295; described later).

In this instance, in FIG. 4 and FIG. 5, reference characters 161 through 164 designate constituents of the quadrature-modulator 16. Reference character 161 designates a multiplier which multiplies the I channel signal by an output of the local oscillator 17 (for example, cos $\omega$t); reference character 164 designates a $\pi/2$ phase shifter which generates a quadrature signal (sin $\omega$t) by shifting the phase of an output of the local oscillator 17 by $\pi/2$; reference character 162 designates a multiplexer which multiplies the Q channel signal by an output (sin $\omega$t) of the $\pi/2$ phase shifter; reference character 163 designates an adder which adds the outputs of the multipliers 161 and 162.

Here, while monitoring the signal after correction by means of a spectrum analyzer (not illustrated) or the like, the correction values in the registers 313 and 314 are updated (changed), whereby gain of the I channel signal and the Q channel signal is separately adjusted to correct amplitude unbalance. This makes it possible to suppress image generation caused by the amplitude unbalance.

Figure 6:
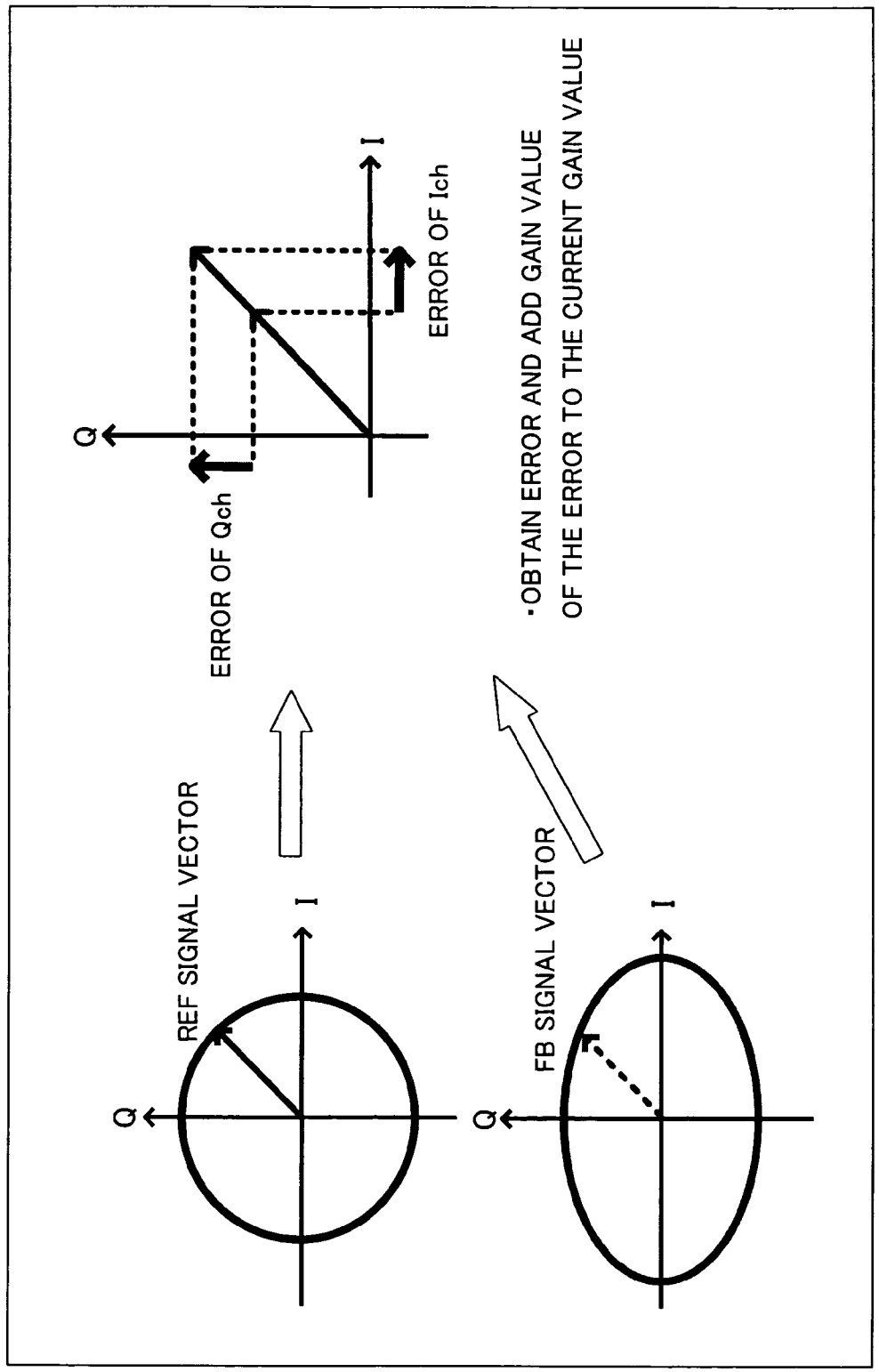
FIG. 6 is a schematic diagram for describing an IQ amplitude balance correcting method carried out by the IQ amplitude balance correcting unit of FIG. 5.

More specifically, as schematically shown in FIG. 6, for example, the IQ balance of the vector of the reference signal X is balanced. Thus, a reference signal X and a feedback Y are separately divided into an I channel signal and a Q channel signal, and differences therebetween are separately obtained. Both difference results are reflected to gain values set to the I channel signal and Q channel signal, whereby the vector of the feedback signal Y becomes the same as that of the reference signal X, so that an error is eliminated.

Figure 7:
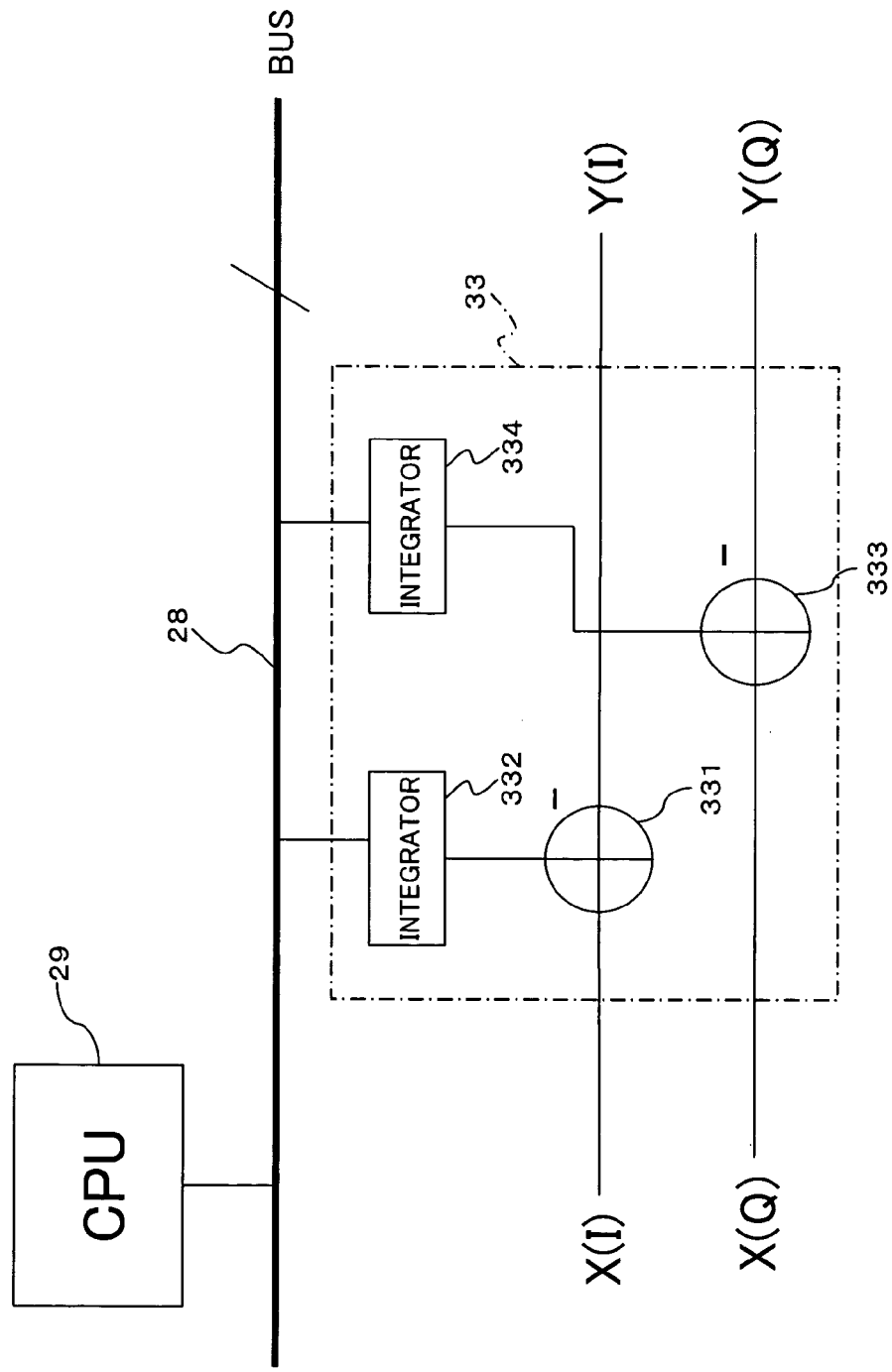
FIG. 7 is a block diagram illustrating an example of a construction of an IQ balance correction value (gain value) calculating circuit which is prepared in order to realize the IQ amplitude balance correcting method of FIG. 6.

Therefore, as shown in FIG. 7, for example, the IQ balance correcting value (gain value) calculating circuit 33 is provided which includes: a subtracter (I channel difference detecting unit) 331 which detects a difference (error) in magnitude (amplitude) between the I channel signal X(I) of the reference signal X and I channel signal Y(I) of the feedback signal Y; an integrator 332, connected to the CPU 29 via the bus 28, for obtaining an integral value of the difference; a subtracter (Q channel difference detecting unit) 333 which detects a difference (error) in magnitude (amplitude) between the Q channel signal X(Q) of the reference signal X and the Q channel signal Y(Q) of the feedback signal Y; and an integrator 334, connected to the CPU 29 via the bus 28, for obtaining an integral value of the difference.

With this arrangement, the subtracter 331 and the subtracter 333 obtain errors in the I channel signal and the Q channel signal of the reference signal X and the feedback signal Y, respectively, and the errors are integrated by the integrators 332 and 334, respectively, and integral values are obtained. In this instance, if the phase of the feedback signal Y and the phase of the reference signal X are turned (deviated), the subtraction processing in the subtracter 331 and the subtracter 333 cannot be performed correctly. Thus, before performing the subtraction processing, a phase relationship between the reference signal X and the feedback signal Y is preferably adjusted.

More specifically, as indicated by the dotted line in FIG. 1, a phase adjusting circuit (phase turning unit) 74 is interposed between the subtracter 25 and the 1/M-clock unit delay circuit 23. With this arrangement, the I channel signal and Q channel signal are separately subjected to phase turning processing, so that the phase relationships of both signals are matched.

Next, the CPU 29 obtains integral values obtained by the integrator 332 and the integrator 334 via the bus 28, and separately averages those values, thereby obtaining mean values of the errors, and normalizes the thus obtained mean values with the magnitude (amplitude) of each channel signal of the reference signal X. From this result, as already described with reference to FIG. 6, the CPU 29 calculates a correction value (correction vector), and sets the thus obtained correction value of each channel to the register 313 and the register 314 of the IQ amplitude balance correcting unit 31 via the bus 28.

That is, the CPU 29 has a function as an amplitude balance correction value calculator 295 (see FIG. 1) which obtains a correction value for IQ amplitude balance that makes the differences detected by the subtracter 331 and the subtracter 333 minimum. Together with the IQ balance correction value (gain value) calculating circuit 33, the CPU 29 functions as an amplitude balance control unit for controlling the IQ amplitude balance correction performed by the IQ amplitude balance correcting unit 31 so that the image detected by the aforementioned image detecting means 293 becomes minimum (that is, so that "yes" judgment is obtained on the step S15 already described with reference to FIG. 2).

Here, in order to gradually perform correction so as to prevent oscillation, it is preferable that the above correction value be set after multiplying the correction vector by a value (μ: step size parameter) smaller than "1". Further, correction values for the both of the I channel signal and the Q channel signal may be set in parallel. However, since it is sufficient that amplitude balance is balanced, the correction values are normalized, and either (for example, Q channel) of the channels is fixed, and setting for only I channel signal can be performed. In this instance, the gain adjustment is usable not only in correction of amplitude unbalance but also in adjustment of the output level of the main signal.

(A4) Quadrature Adjustment

The quadrature (IQ quadrature) between the I channel signal and the Q channel signal is lost when the local frequency of the quadrature-modulator 16 does not realize quadrature.

When a correct quadrature modulation is realized with ω, the signal is expressed by:

$$I \cos(\omega t) - Q \sin(\omega t) \quad (3)$$

Figure 8:
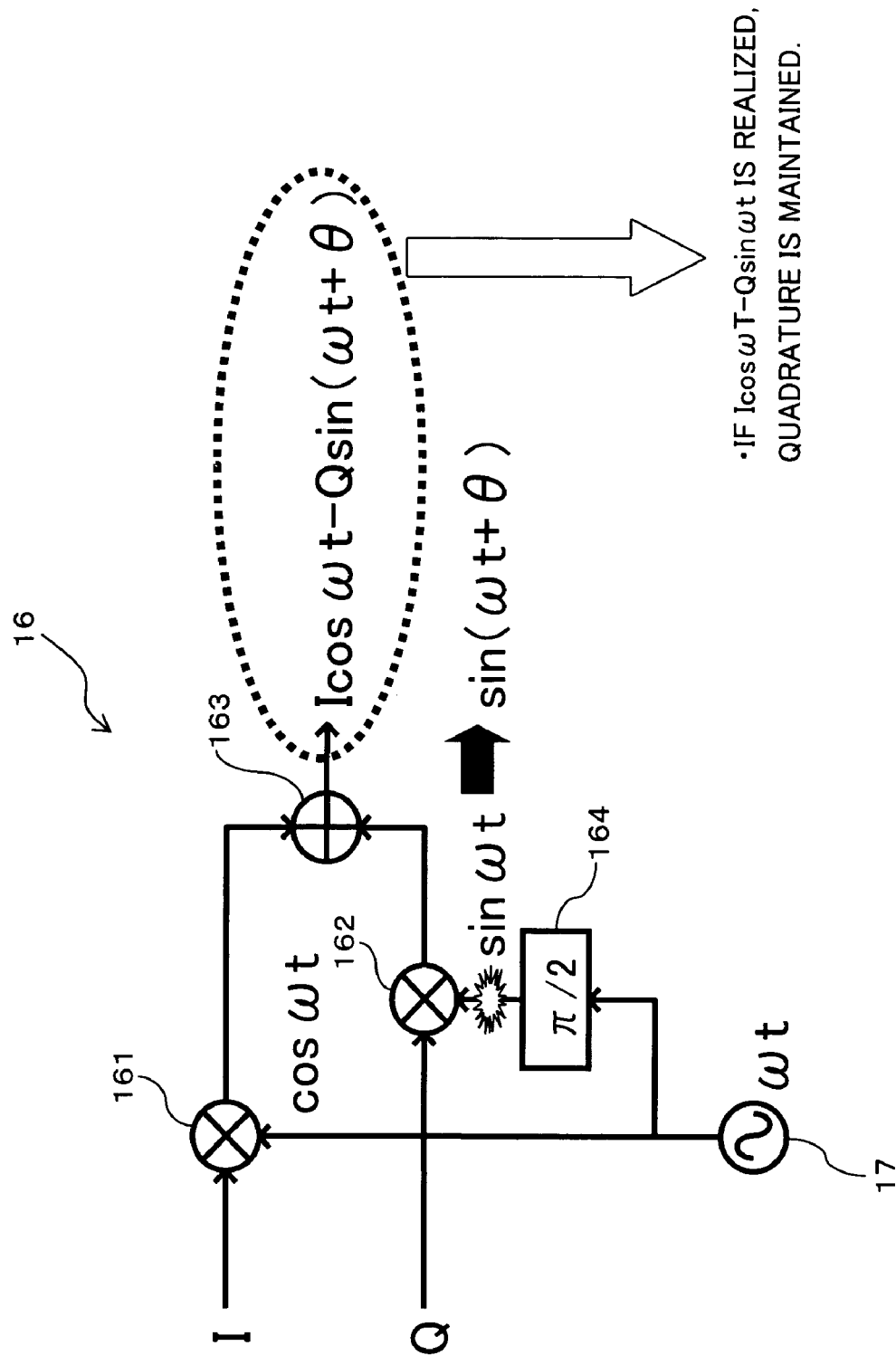
FIG. 8 is a diagram for describing a phenomenon in which IQ quadrature degree is lost.

Here, as shown in FIG. 8, when the Q channel has a θ phase component, the signal after modulation is expressed by:

$$I' \cos(\omega t) - Q' \sin(\omega + \theta) \quad (4)$$

This formula (4) can be converted into the following fomula (5):

$$(I'+Q' \sin \theta)\cos(\omega t) - Q' \cos \theta \sin(\omega t) \quad (5)$$

In order to make the formula (5) the same as the formula (3), the I channel signal should be the following formula (6), and the Q channel signal should be the following formula (7).

$$I = I' - Q' \sin \theta \quad (6)$$

$$Q = Q' \cos \theta \quad (7)$$

Thus, from these formulas (6) and (7), the following formulas (8) and (9) are obtained.

$$I' = I + Q \tan \theta \quad (8)$$

$$Q' = Q/\cos \theta \quad (9)$$

Accordingly, when the quadrature degree deviation θ is determined, the arithmetic operation of the formula (8) for the I channel signal and the arithmetic operation of the formula (9) for the Q channel signal are separately performed, whereby it is possible to correct the IQ quadrature.

Figure 9:
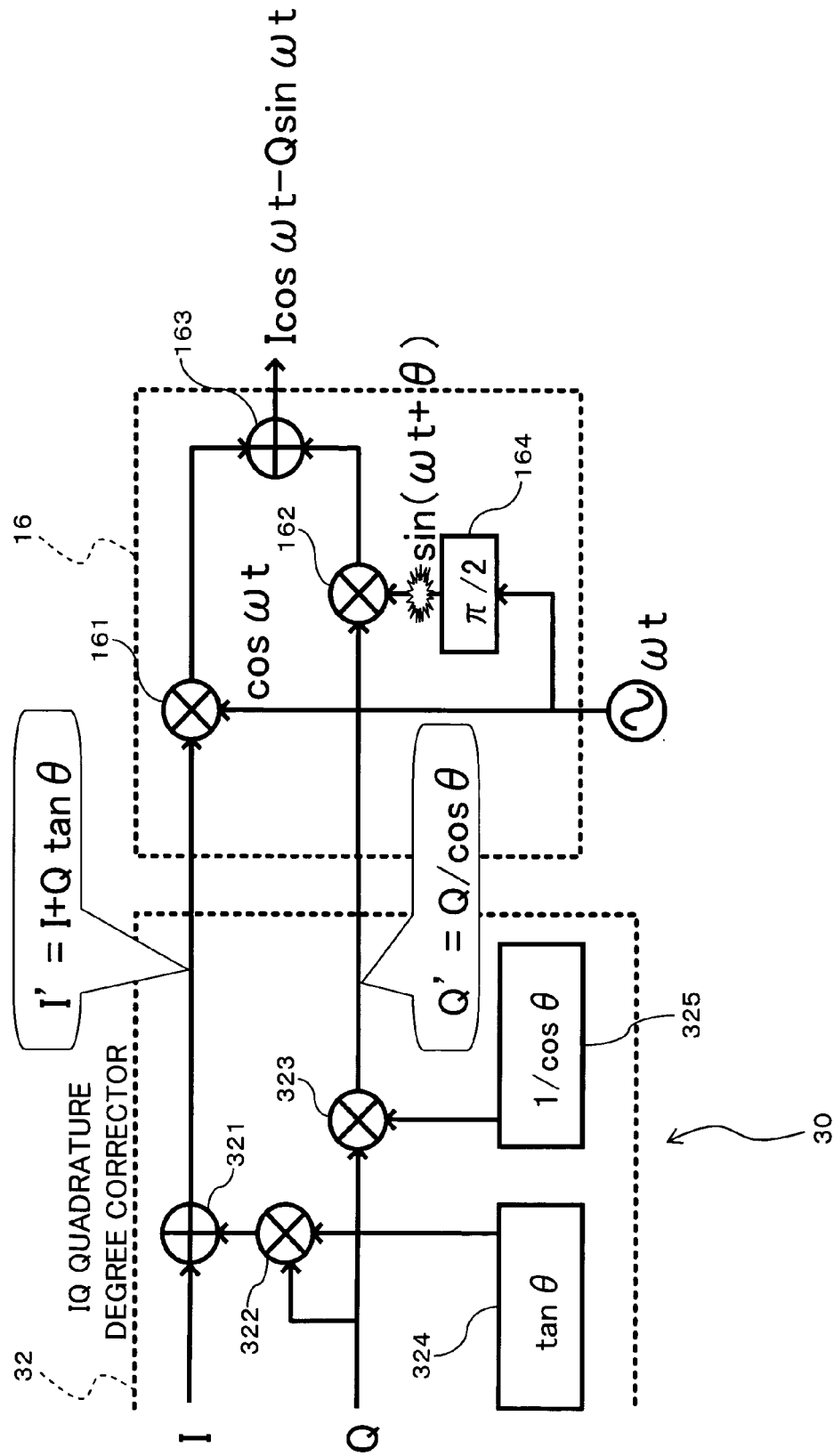
FIG. 9 is a block diagram illustrating constructions of the IQ amplitude balance/quadrature degree correcting unit (IQ quadrature degree correcting unit) and the quadrature-modulator of FIG. 1.

Hence, as shown in FIG. 9, the correction unit 30 of the present example has the IQ quadrature (orthogonal) degree correcting unit 32 for correcting the quadrature degree between the I channel signal component and the Q channel signal component. The IQ quadrature degree correcting unit 32 includes: the adder 321 and the multiplier 322, which perform an arithmetic operation of the above formula (8) for the I channel signal before the quadrature-modulator 16; the multiplier 323, which performs an arithmetic operation of the above formula (9) also before the quadrature-modulator 16; the register 324 storing a value of tan θ; and the register 325 storing a value of 1/cos θ.

That is, the multiplier 322 multiplies the Q channel signal by the value (tan θ) held in the register 324, thereby performing an arithmetic operation of the second term of the above formula (8). The adder 321 adds an output(Q tan θ) of the multiplier 322 to the I channel signal, thereby performing an arithmetic operation of the above formula (8). The multiplier 323 multiplies the Q channel signal by the value (1/cos θ) of register 325, thereby realizing an arithmetic operation of the above formula (9). These adder 321 and the multipliers 322 and 323 realize a phase correcting circuit for correcting the phase relationship between the I channel signal component and the Q channel signal component of the input signal X with a correction value obtained by the CPU 29, which functions as a quadrature degree correction value calculator (described later) and with a conversion table 35 (see FIG. 10).

In this instance, the quadrature degree correcting unit 32 can be provided before or after the IQ amplitude balance correcting unit 31.

Further, the quadrature degree deviation θ can be calculated as follows.

That is, provided the reference signal X=Tx_i+jTx_q, the power Ref_Pow of the reference signal X is expressed by the following formula (10):

$$Ref\_Pow = Tx\_i^2 + Tx\_q^2 \quad (10)$$

Here, if the reference signal X is subjected to quadrature modulation with an angular frequency ω, the transmission signal is expressed by:

$$Tx\_i \cos \omega t - Tx\_q \sin(\omega t + \theta)$$

because of the quadrature degree deviation θ. When this signal is modulated, the following formula (11) is obtained:

$$\begin{aligned}
\{Tx\_i\cos\omega t - Tx\_q \\
\sin(\omega t + \theta)\} \cdot \\
(\cos\omega t + j\sin\omega t)
\end{aligned} \quad \begin{aligned}
&= \{Tx\_i\cos 2\omega t - Tx\_q\sin(\omega t + \theta) \\
&\quad \cos\omega t\} + j\{Tx\_i\cos\omega t\sin\omega t + Tx\_q\sin \\
&\quad (\omega t + \theta)\sin\omega t\} \\
&= 1/2 \cdot Tx\_i(\cos 2\omega t + 1) - 1/2 \cdot \\
&\quad Tx\_q\{\sin(2\omega t + \theta) + \sin\theta\} + j[1/2 \cdot \\
&\quad Tx\_i\sin 2\omega t - 1/2 \cdot \\
&\quad Tx\_q\{\cos(2\omega t + \theta) - \cos\theta\}]
\end{aligned} \quad (11)$$

Here, if a two-time wave is cut by a filter (not illustrated), and further, if gain is added, the feedback signal Y is expressed by:

(Tx_I−Tx_q sin θ)+jTx_q cos θ

Accordingly, the power FB_Pow of the feedback signal Y is expressed by:

$$\begin{aligned}
FB\_Pow &= (Tx\_i - Tx\_q\sin\theta)^2 + (Tx\_q\cos\theta)^2 \\
&= Tx\_i^2 + Tx\_q^2 - 2Tx\_iTx\_q\sin\theta \\
&= Ref\_Pow - 2Tx\_iTx\_q\sin\theta
\end{aligned} \quad (12)$$

Thus, the quadrature degree deviation θ is obtained by the following formula (13).

$$\text{Sin } \theta = (Ref\_Pow - FB\_Pow)/2Tx\_iTx\_q \quad (13)$$

$$\therefore \theta = \sin^{-1}\{(Ref\_Pow - FB\_Pow)/2Tx\_iTx\_q\} \quad (14)$$

Figure 10:
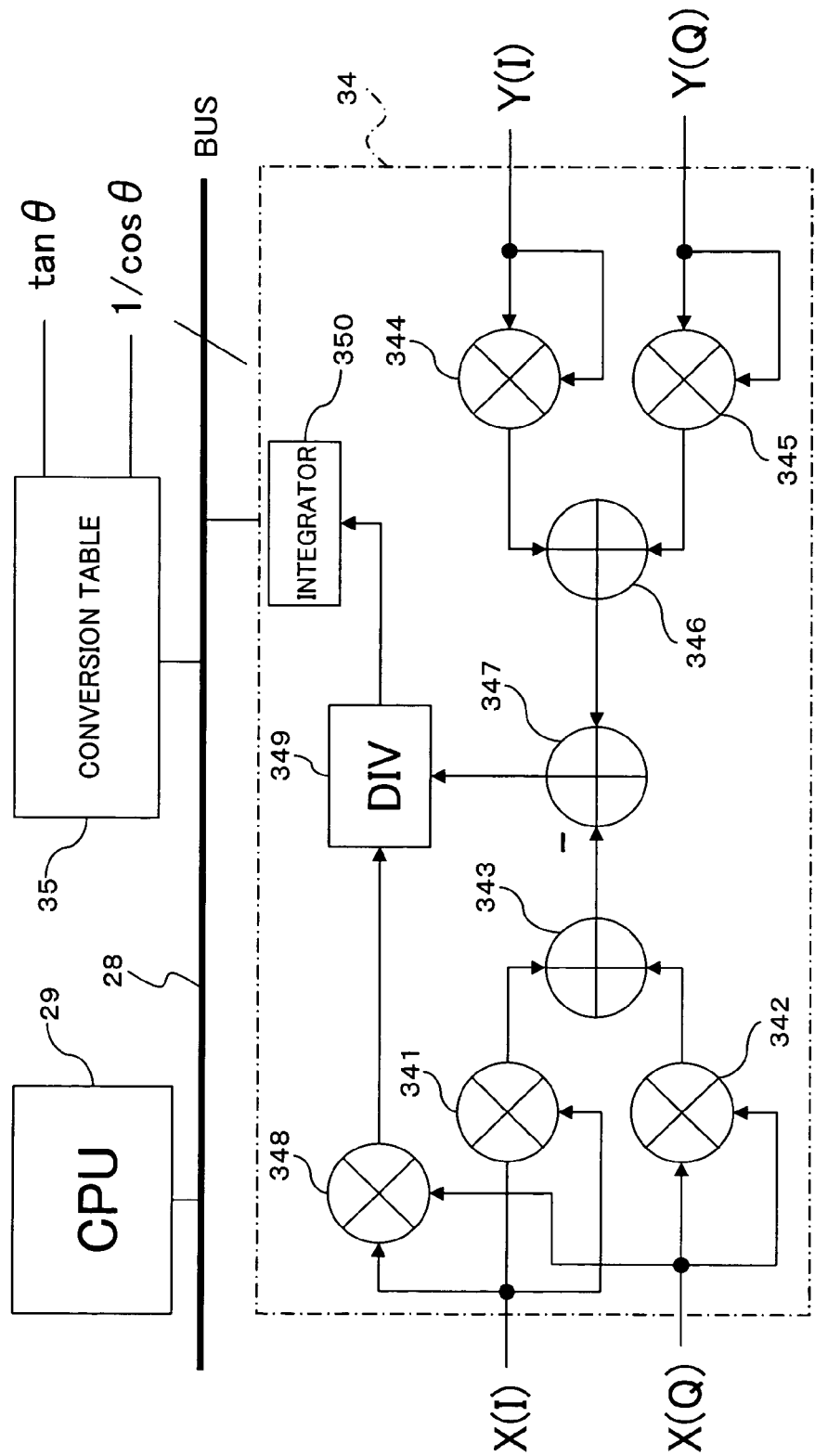
FIG. 10 is a block diagram illustrating an example of a construction of a quadrature degree deviation calculating circuit which is prepared for correction carried out by the IQ quadrature degree correcting unit of FIG. 9.
Figure 11:
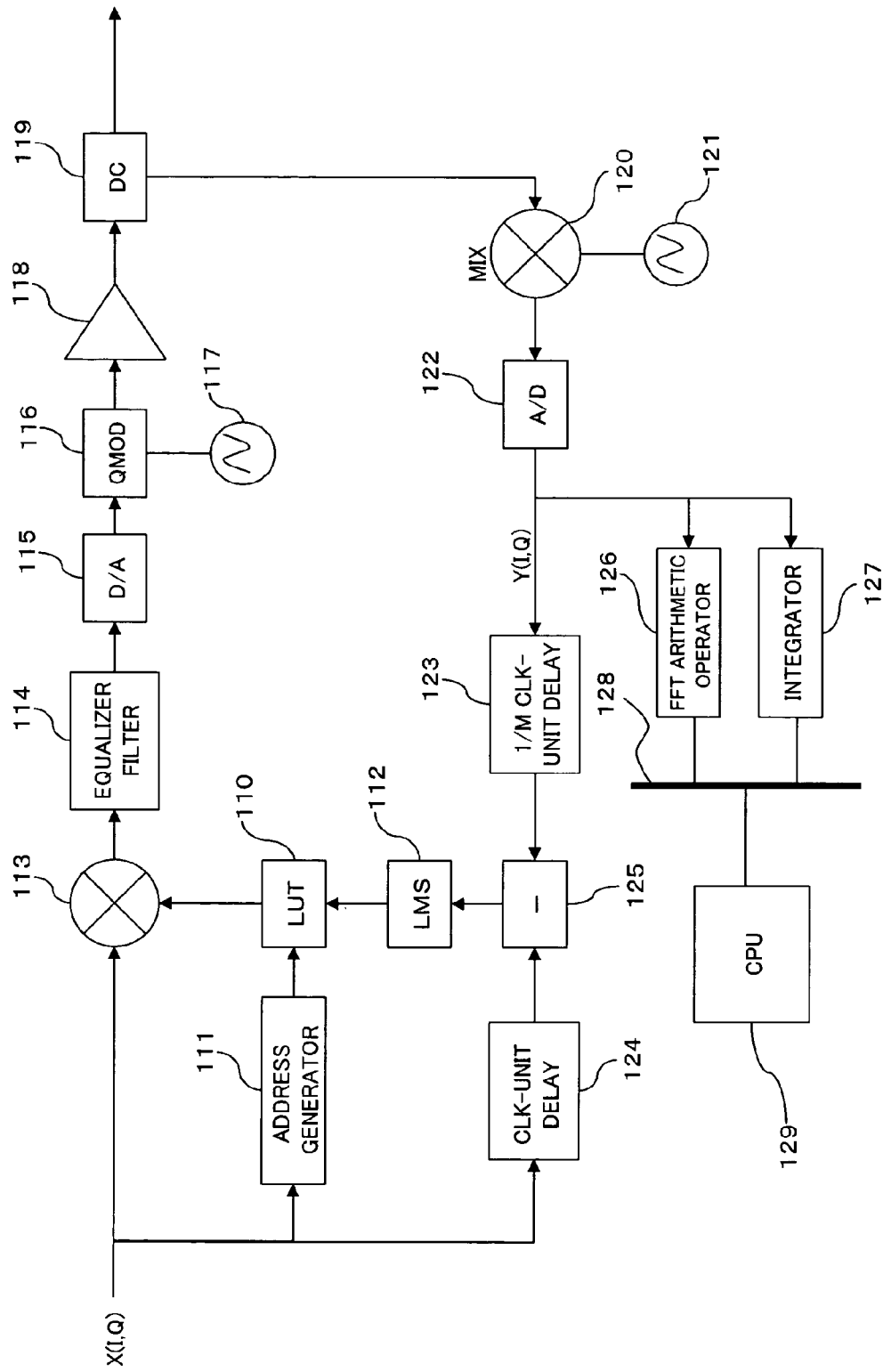
FIG. 11 is a block diagram illustrating a construction of an important part of a previous digital predistortion (DPD) amplifier.
Figure 12:
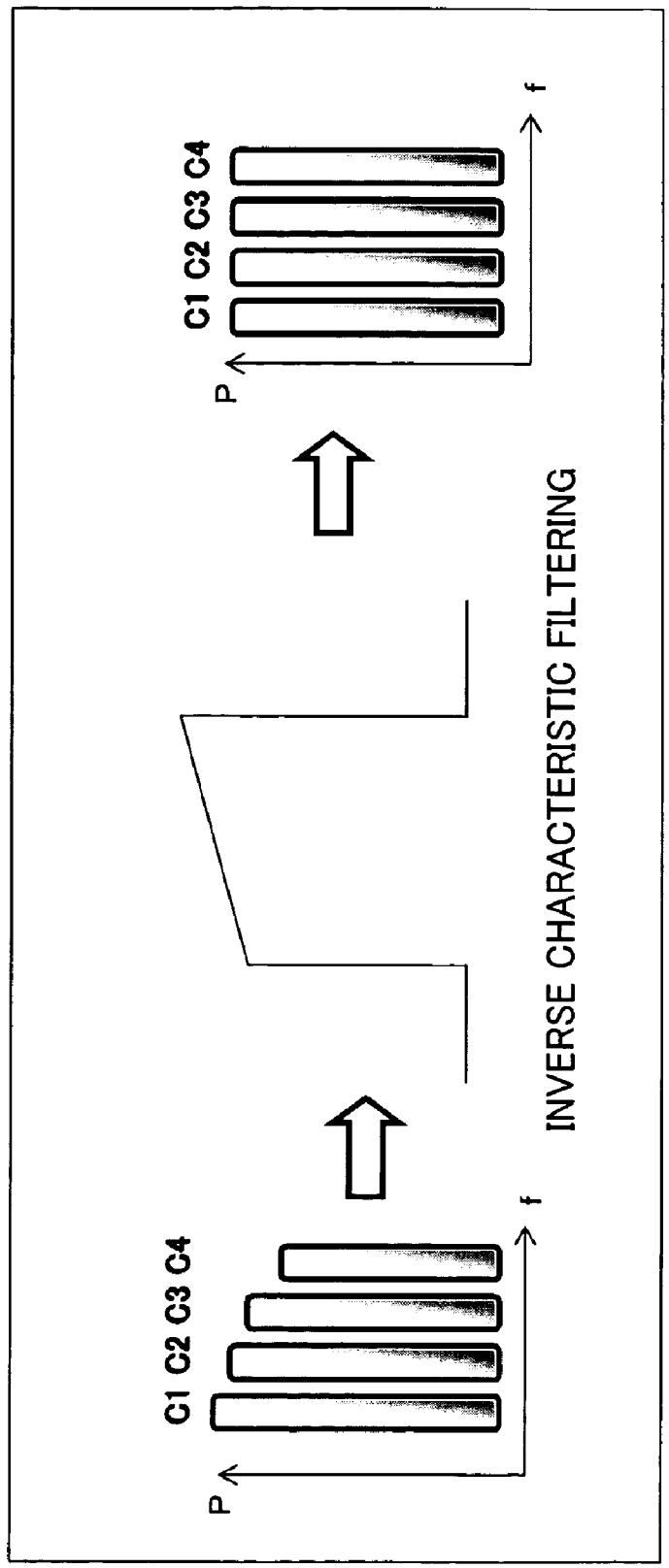
FIG. 12 is a schematic diagram for describing a function of an equalizer filter of FIG. 11.
Figure 13:
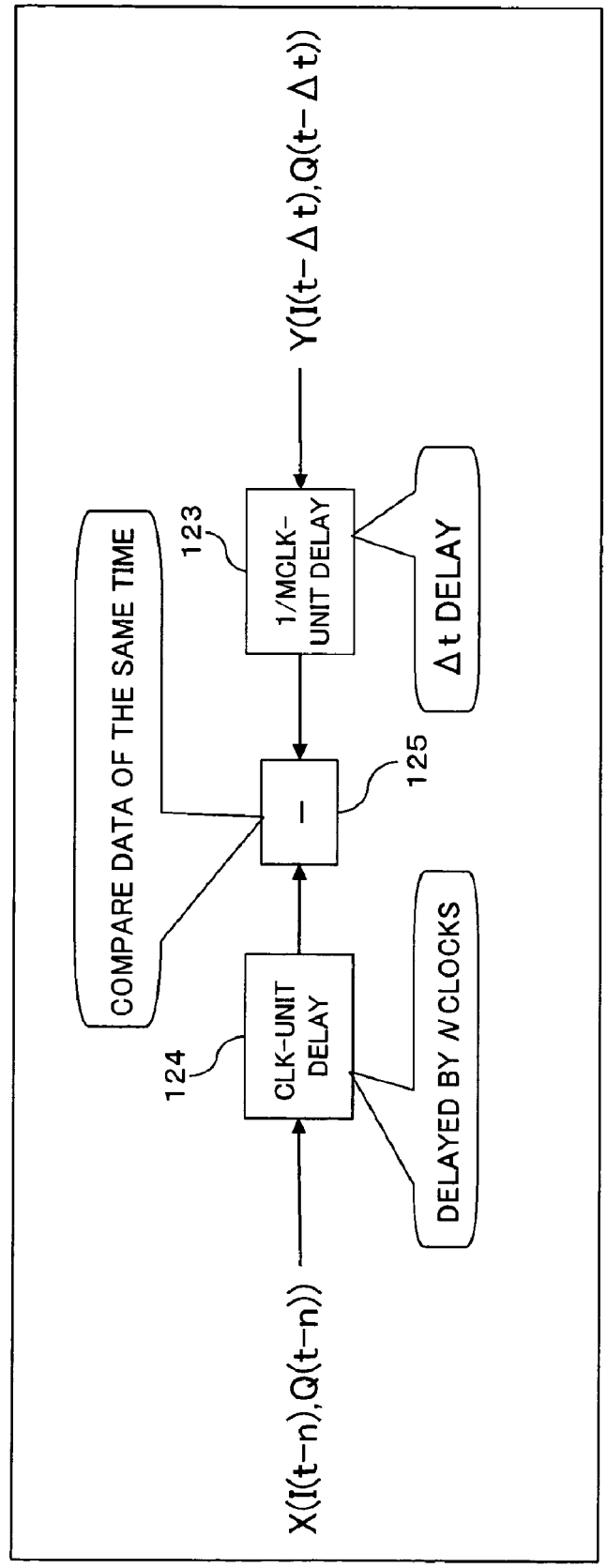
FIG. 13 is a diagram for describing a function of a delay circuit of FIG. 11.

To realize an arithmetic operation expressed by these formulas (13) and (14), as shown in FIG. 10, for example, in addition to the IQ quadrature degree correcting unit 32, the DPD amplifier of the present example further has the quadrature degree deviation calculating circuit (quadrature degree deviation calculating circuit) 34 which includes: the multipliers 341, 342, 344, 345, and 348; the adders 343 and 346; the subtracter 347; the divider (DIV) 349; and the integrator 350, and the conversion table 35.

Here, the multiplier 341 obtains a square of the I channel signal X(I) of the reference signal X; the multiplier 342 obtains a square of the Q channel signal X(Q) of the reference signal X; the adder 343 adds the square results of the multipliers 341 and 342. That is, these multipliers 341 and 342 and the adder 343 obtain a complex square sum of the I channel component and Q channel component of the reference signal X, thereby obtaining the power Ref_Pow of the reference signal X expressed by the above formula (10).

Likewise, the multiplier 344 obtains a square of the I channel signal Y(I) of the reference signal Y; the multiplier 345 obtains a square of the Q channel signal Y(Q) of the reference signal Y. The adder 346 adds the square results of the multipliers 344 and 345. That is, these multipliers 344 and 345 and the adder 346 obtain a complex square sum of the I channel component and Q channel component of the reference signal Y, thereby obtaining the power of the reference signal Y expressed by the above formula (12).

The subtracter 347 subtracts the addition results of the adders 343 and 346, thereby obtaining the numerator of the above formula (13), that is, "the power (Ref_Pow) of the reference signal X—(FB_Pow) of the feedback signal Y". In this instance, under a state where the phase relationship of each signal to be subjected to subtraction is deviated, it is impossible to obtain a correct subtraction result, so that phase relationship adjustment of both signals is preferably performed before the subtraction processing is carried out.

The multiplier 348 multiplies the I channel signal X(I) of the reference signal and the Q channel signal X(Q), thereby obtaining a value equivalent to a denominator of the above formula (13); the divider 349 divides the subtraction result of the above subtracter 347 by the multiplication result of the multiplier 348, thereby realizing an operation of the above formula (13).

The integrator 350 integrates the division result (sin θ) of the divider 349 and obtains a mean value. This mean value is acquired by the CPU 29 via the bus 28, and the correction value of the IQ quadrature degree (the values of tan θ and 1/cos θ) is obtained with the conversion table 35.

Then, the CPU 29 obtains the mean value from the integrator 350, and performs an arithmetic operation of sin−1, thereby obtaining the quadrature degree deviation θ. The CPU 29 then obtains a value of tan θ and 1/cos θ corresponding to the deviation with the conversion table 35 by table index, and sets the obtained values to the aforementioned registers 324 and 325 of the IQ quadrature degree correcting unit 32 via the bus 28.

That is, the quadrature degree deviation calculating circuit 34 functions as a circuit for obtaining a quadrature degree deviation θ based on a power value of the input signal X and a power value of the output signal of the amplifier 18. The CPU 29 and the conversion table 35 function as a quadrature degree correction value calculator for obtaining a correction value for an IQ quadrature degree which makes the quadrature degree deviation θ obtained by the quadrature degree deviation calculating circuit 34 minimum. Further, the CPU 29, quadrature degree deviation calculating circuit 34, and conversion table 35 function as a quadrature degree control unit for controlling IQ quadrature degree correction performed by the quadrature degree correcting unit 32 in such a manner that an image detected by the image detecting means 293 becomes minimum.

Here, in the above-described IQ quadrature degree correction, the correction is performed gradually to avoid oscillation. Thus, the mean value (correction vector) obtained by the integrator 350 is divided by a value (μ: step size parameter) smaller than "1", and the correction value is set.

In this instance, the IQ quadrature degree correctable range can be set to, for example, −5.12° through 5.10° (0.02° step size), as a value of the quadrature degree deviation θ. In this case, also, while monitoring the signal after correction by means of a spectrum analyzer or the like, the correction values in the registers 324 and 325 are updated (changed), whereby the quadrature degree between the I channel signal and the Q channel signal is adjusted to suppress image generation caused by IQ quadrature degree break down.

As described so far, according to the present embodiment, before starting normal ACLR-type distortion correction processing as shown in FIG. 3, the processing (steps S11 through S15) already described with reference to FIG. 2 is performed to check if the distortion correction monitoring point and an image generating point overlap each other. When they both overlap each other, IQ amplitude balance correction and IQ quadrature degree correction are performed, so that effects (generation of an image component) of incompleteness of quadrature modulation by the quadrature-modulator 16 can be suppressed before ACLR-type distortion correction processing is performed. Accordingly, a phenomenon in which parameters in the equalizer filter 14 and the 1/M-clock unit delay circuit 23 are separated from the optimum parameter values every time the parameters are updated is prevented, and it is possible to optimize the parameters.

The present invention should by no means be limited to the above-illustrated embodiment, and various changes or modifications may be suggested without departing from the gist of the invention.

For example, the present embodiment includes both of the amplitude balance correcting unit 31 and the quadrature degree correcting unit 32 as the correcting unit 30. However, only either one of the above two can provide an image component reduction effect.

As described above, according to the present invention, it is possible to suppress an effect (noise component generation) of incomplete quadrature modulation before parameter correction (updating). Thus, it is possible to avoid a state where a distortion component cannot be accurately detected due to effects of the noise component (image). Therefore, a phenomenon in which parameters are separated from the optimum parameter values every time the parameters are updated is prevented, and it is possible to optimize the parameters. Accordingly, for example, the present invention is significantly useful in the field of mobile communication technology.

What is claimed is:

1. A distortion compensating apparatus which compensates for nonlinearity of an amplifier by quadrature-modulating an input signal before inputting the input signal to the amplifier and by adaptively updating a distortion compensation coefficient for the input signal based on a difference between the input signal and an output signal of the amplifier, said apparatus comprising:
   distortion amount detecting means which detects the amount of distortion of an output signal of the amplifier;
   parameter holding means which holds a parameter having been set therein, said parameter holding means being capable of varying the difference according to the parameter set therein;
   parameter correcting means which corrects the parameter held in said parameter holding means in such a manner that the distortion amount detected by said distortion amount detecting means is improved;
   noise component detecting means which detects a noise component that can be caused in the output signal resulting from the quadrature-modulation; and
   noise component removing means which performs processing for removing the noise component detected by said noise component detecting means.

2. A distortion compensating apparatus as set forth in claim 1, wherein said noise component removing means includes:
   an amplitude balance correcting unit which corrects amplitude balance between an I channel signal component and a Q channel signal component of the input signal;
   an amplitude balance control unit which controls the correction of the amplitude balance performed by said amplitude balance correcting unit in such a manner that the noise component detected by said noise component detecting means becomes minimum.

3. A distortion compensating apparatus as set forth in claim 1, wherein said noise component removing means includes:
   a quadrature degree correcting unit which corrects the quadrature degree between an I channel signal component and a Q channel signal component of the input signal; and
   a quadrature degree control unit which controls the quadrature degree correction performed by said quadrature degree correcting unit in such a manner that the noise component detected by said noise component detecting means becomes minimum.

4. A distortion compensating apparatus as set forth in claim 2, wherein said noise component removing means includes:
   a quadrature degree correcting unit which corrects the quadrature degree between an I channel signal component and a Q channel signal component of the input signal; and
   a quadrature degree control unit which controls the quadrature degree correction performed by said quadrature degree correcting unit in such a manner that the noise component detected by said noise component detecting means becomes minimum.

5. A distortion compensating apparatus as set forth in claim 2,
   wherein said amplitude balance controlling unit includes:
      an I channel difference detecting circuit which detects a difference of an I channel signal component between the output signal of the amplifier and the input signal;
      a Q channel difference detecting circuit which detects a difference of a Q channel signal component between the output signal of the amplifier and the input signal; and
      an amplitude balance correction value calculating unit which obtains an amplitude balance correction value that makes the difference detected by said difference detecting circuits minimum, and
   wherein said amplitude balance correcting unit includes:
      an amplitude correcting circuit which separately corrects the amplitudes of the I channel signal component and the Q channel signal component of the input signal with a correction value obtained by said amplitude balance correction value calculating unit.

6. A distortion compensating apparatus as set forth in claim 3,
   wherein said quadrature degree control unit includes:
      a quadrature degree deviation calculating circuit which obtains a deviation of the quadrature degree on the basis of the power value of the input signal and the power value of the output signal of said amplifier;
      a quadrature degree correction value calculating unit which obtains a correction value of the quadrature degree, said correction value making the deviation, obtained by said quadrature degree deviation calculating circuit, minimum, and
   wherein said quadrature degree correcting unit includes: a phase correcting circuit which corrects a phase relationship between the I channel signal component and the Q channel signal component of the input signal with a correction value obtained by said quadrature degree correction value calculating unit.

7. A distortion compensating method for compensating for nonlinearity of an amplifier by quadrature-modulating an input signal before inputting the input signal to the amplifier and by adaptively updating a distortion compensation coefficient for the input signal based on a difference between the input signal and an output signal of the amplifier, said method comprising the steps of:
   (a) detecting the amount of distortion of an output signal of the amplifier;
   (b) correcting a parameter held in a parameter holding means, which is capable of varying the difference according to the parameter set therein, in such a manner that the distortion amount detected at said step (a) is improved;

(c) detecting a noise component that can be caused in the output signal resulting from the quadrature-modulation; and (d) performing processing for removing the noise component detected on said step (c).

8. A distortion compensating method as set forth in claim 7, wherein said step (d) includes the step of: correcting amplitude balance between an I channel signal component and a Q channel signal component of the input signal in such a manner that the noise component detected on said step (a) becomes minimum.

9. A distortion compensating method as set forth in claim 7, wherein said step (d) includes the step of: correcting the quadrature degree between an I channel signal component and a Q channel signal component of the input signal in such a manner that the noise component detected on said step (a) becomes minimum.

10. A distortion compensating method as set forth in claim 8, wherein said step (d) includes the step of: correcting the quadrature degree between an I channel signal component and a Q channel signal component of the input signal in such a manner that the noise component detected on said step (a) becomes minimum.

11. A distortion compensating method for compensating for nonlinearity of an amplifier by quadrature-modulating an input signal before inputting the input signal to the amplifier and by adaptively updating a distortion compensation coefficient for the input signal based on a difference between the input signal and an output signal of the amplifier, said distortion compensating method comprising:

detecting the amount of distortion of an output signal of the amplifier;

correcting a parameter held in a parameter holding part, which is capable of varying the difference according to the parameter set therein, in such a manner that the distortion amount is improved;

detecting a noise component that can be caused in the output signal resulting from the quadrature-modulation; and performing processing for removing the noise component.

* * * * *